United States Patent
Bellessort et al.

(10) Patent No.: US 10,051,090 B2
(45) Date of Patent: Aug. 14, 2018

(54) METHODS AND DEVICES FOR ENCODING AND DECODING MESSAGES

(71) Applicants: Romain Bellessort, Rennes (FR); Youenn Fablet, La Dominelais (FR); Hervé Ruellan, Rennes (FR)

(72) Inventors: Romain Bellessort, Rennes (FR); Youenn Fablet, La Dominelais (FR); Hervé Ruellan, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 243 days.

(21) Appl. No.: 14/362,106

(22) PCT Filed: Nov. 5, 2012

(86) PCT No.: PCT/EP2012/071863
§ 371 (c)(1),
(2) Date: May 30, 2014

(87) PCT Pub. No.: WO2013/079277
PCT Pub. Date: Jun. 6, 2013

(65) Prior Publication Data
US 2014/0355627 A1    Dec. 4, 2014

(30) Foreign Application Priority Data
Dec. 2, 2011 (WO) .................. PCT/IB2011/055441

(51) Int. Cl.
*H04L 29/06* (2006.01)
*H03M 7/30* (2006.01)
*H04L 29/08* (2006.01)

(52) U.S. Cl.
CPC .......... *H04L 69/04* (2013.01); *H03M 7/3088* (2013.01); *H04L 69/22* (2013.01); *H04L 67/02* (2013.01)

(58) Field of Classification Search
None
See application file for complete search history.

(56) References Cited

U.S. PATENT DOCUMENTS

| | | | | |
|---|---|---|---|---|
| 6,069,999 A | * | 5/2000 | Gabor | G06K 15/02 358/1.11 |
| 2007/0220204 A1 | * | 9/2007 | Nakajima | G06F 3/0607 711/114 |

(Continued)

FOREIGN PATENT DOCUMENTS

WO    2011067769 A1    6/2011

OTHER PUBLICATIONS

Butler, et al., "A Proposal for Shared Dictionary Compression over HTTP", Sep. 8, 2008 (Sep. 8, 2008), pp. 1-18, XP055026339, Retrieved from the Internet: URL:http://www.blogs.zeenor.com/wp-content/uploads/2011/01/Shared_Dictionary_Compression_over_HTTP.pdf [retrieved on May 7, 2012] p. 1-p. 2.

(Continued)

*Primary Examiner* — Jeffrey M Rutkowski
*Assistant Examiner* — Mehedi Aley
(74) *Attorney, Agent, or Firm* — Canon USA, Inc. I.P. Division

(57) ABSTRACT

Methods and devices for encoding or decoding messages, each message including a list of information items. The encoding method comprises determining a first list of indexes associated with information items that are already indexed in a local indexing table and a second list of literal values of other information items not yet indexed in said indexing table; encoding the indexes of the first list; binary compressing at least a serialized binary representation of the literal values of the second list; and concatenating the first list and the second list together to obtain an encoded bitstream of the information items. When the messages are sent over a plurality of connections, a global table is shared (Continued)

| Connection #1 | | |
|---|---|---|
| Index | HTTP header | Cost |
| 0 | Status: 200 OK | 12 |
| 1 | Version: HTTP/1.1 | 15 |
| 2 | Server: Apache/2.2.14 (Ubuntu) | 28 |
| 3 | Content-Type: text/html | 22 |

| Connection #2 | | |
|---|---|---|
| Index | HTTP header | Cost |
| 0 | Status: 200 OK | 12 |
| 1 | Version: HTTP/1.1 | 15 |
| 2 | Server: Apache/2.2.14 (Ubuntu) | 28 |
| 3 | Content-Type: image/jpeg | 23 |

| TOTAL | 155 |
|---|---|

| Connection #1 | | | Connection #2 | | |
|---|---|---|---|---|---|
| Index | Reference | Cost | Index | Reference | Cost |
| 0 | A | 4 | 0 | A | 4 |
| 1 | B | 4 | 1 | B | 4 |
| 2 | C | 4 | 2 | C | 4 |
| 3 | D | 4 | 3 | E | 4 |

| Server Global List of Processed Headers | | |
|---|---|---|
| Ref. | HTTP header | Cost |
| A | Status: 200 OK | 12 |
| B | Version: HTTP/1.1 | 15 |
| C | Server: Apache/2.2.14 (Ubuntu) | 28 |
| D | Content-Type: text/html | 22 |
| E | Content-Type: image/jpeg | 23 |

| TOTAL | 132 |
|---|---| between the connections to store the indexed items of information; and a local indexing table for each connection associates indexes with references to an entry of the shared global table.

40 Claims, 11 Drawing Sheets

(56) References Cited

U.S. PATENT DOCUMENTS

| | | | |
|---|---|---|---|
| 2008/0148141 A1 | 6/2008 | Heuer et al. | |
| 2009/0070543 A1* | 3/2009 | Oh | H03M 7/3086 |
| | | | 711/170 |
| 2010/0010995 A1* | 1/2010 | Fablet | G06F 17/30917 |
| | | | 706/46 |
| 2011/0016384 A1* | 1/2011 | Shagam | G06F 17/211 |
| | | | 715/242 |
| 2012/0147971 A1* | 6/2012 | Chien | H03M 7/40 |
| | | | 375/240.23 |
| 2013/0246906 A1* | 9/2013 | Hamon | G06F 17/2252 |
| | | | 715/234 |
| 2014/0379843 A1* | 12/2014 | Schaefers | H04L 67/1097 |
| | | | 709/213 |
| 2016/0088059 A1* | 3/2016 | Belshe | H04L 29/06 |
| | | | 709/247 |

OTHER PUBLICATIONS

Adiego, et al., "Lempel-Ziv compression of highly structured documents", Journal of the American Society for Information Science and Technology, Wiley & Sons, New York, NY, UA, vol. 58, No. 4, Jan. 25, 2007 (Jan. 25, 2007), pp. 461-478, XP002455183, ISSN: 1532-2882, DOI: 10.1002/ASI.20496 figures 4-6.

Sundaresan, et al., "Algorithms and programming models for efficient representation of XML for Internet applications", Computer Networks, Elsevier Science Publishers B.V., Amsterdam, NL, vol. 39, No. 5, Aug. 5, 2002 (Aug. 5, 2002), pp. 681-697, XP004369439, ISSN: 1389-1286, DOI: 10.1016/S1389-1286 (02) 00224-4 figure 2.

Welch, T.A., "A Technique for High-Performance Data Compression", Computer, IEEE Service Center, Los Alamitos, CA, US, Jun. 1, 1984 (Jun. 1, 1984), pp. 8-19, XP000743063, ISSN: 0018-9162, DOI: 10.1109/MC.1984.1659158 p. 15-p. 16.

* cited by examiner

HTTP headers in HTTP request

```
Host: en.wikipedia.org
User-Agent: Mozilla/5.0 (Windows; en-US) Gecko/20110303 Firefox/3.6.15
Accept:text/html,application/xhtml+xml,application/xml;q=0.9,*/*;q=0.8
Accept-Language: en-us,en;q=0.5
Keep-Alive: 115
Proxy-Connection: keep-alive
```

HTTP headers in HTTP response

```
Date: Thu, 15 Sep 2011 13:38:15 GMT
Server: Apache
Location: http://en.wikipedia.org/wiki/SPDY
Content-Encoding: gzip
Content-Type: text/html; charset=utf-8
Content-Length: 20
```

Fig. 1

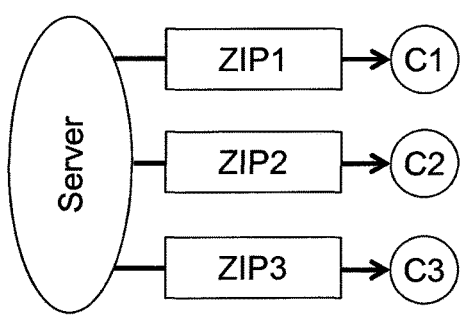

Fig. 2a

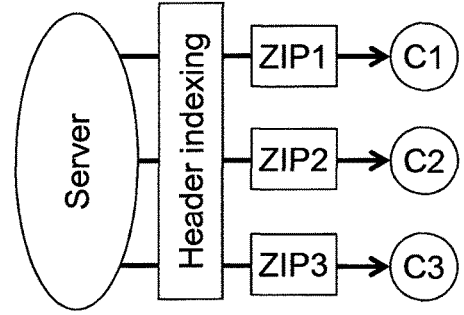

Fig. 2b

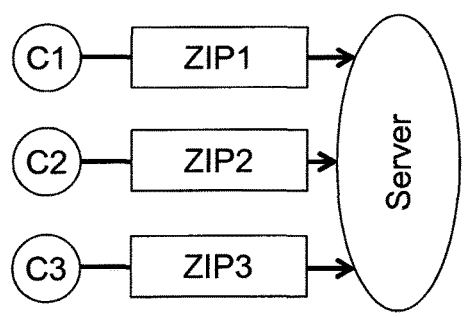

Fig. 2c

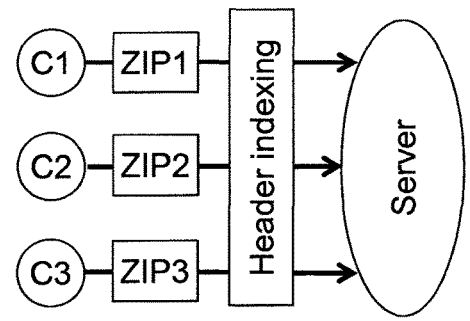

Fig. 2d

| Connection #1 | | |
|---|---|---|
| Index | HTTP header | Cost |
| 0 | Status: 200 OK | 12 |
| 1 | Version: HTTP/1.1 | 15 |
| 2 | Server: Apache/2.2.14 (Ubuntu) | 28 |
| 3 | Content-Type: text/html | 22 |

| Connection #2 | | |
|---|---|---|
| Index | HTTP header | Cost |
| 0 | Status: 200 OK | 12 |
| 1 | Version: HTTP/1.1 | 15 |
| 2 | Server: Apache/2.2.14 (Ubuntu) | 28 |
| 3 | Content-Type: image/jpeg | 23 |
| TOTAL | | 155 |

Fig. 4a

| Connection #1 | | |
|---|---|---|
| Index | Reference | Cost |
| 0 | A | 4 |
| 1 | B | 4 |
| 2 | C | 4 |
| 3 | D | 4 |

| Connection #2 | | |
|---|---|---|
| Index | Reference | Cost |
| 0 | A | 4 |
| 1 | B | 4 |
| 2 | C | 4 |
| 3 | E | 4 |

| Server Global List of Processed Headers | | |
|---|---|---|
| Ref. | HTTP header | Cost |
| A | Status: 200 OK | 12 |
| B | Version: HTTP/1.1 | 15 |
| C | Server: Apache/2.2.14 (Ubuntu) | 28 |
| D | Content-Type: text/html | 22 |
| E | Content-Type: image/jpeg | 23 |
| TOTAL | | 132 |

Fig. 4b

| 0 | 1 | 2 | 3 | 4 | 5 | 6 | 7 |
|---|---|---|---|---|---|---|---|
| 0 | 1 | 0 | \multicolumn{5}{c\|}{0 0000 – 1 1110<br>Index of reference header (0 to 30)} |
| | | | \multicolumn{5}{c\|}{1 1111<br>Index of reference header (>30)} |

Fig. 16

| 0 | 1 | 2 | 3 | 4 | 5 | 6 | 7 |
|---|---|---|---|---|---|---|---|
| 0 | 1 | 1 | Indexing mode | \multicolumn{4}{c\|}{0000 – 1110<br>Index of reference header (0 to 14)} |
| | | | | \multicolumn{4}{c\|}{1111<br>Index of reference header (>14)} |

Fig. 17

| 0 | 1 | 2 | 3 | 4 | 5 | 6 | 7 |
|---|---|---|---|---|---|---|---|
| 0 | \multicolumn{7}{c\|}{000 0000 – 111 1111<br>Header value length on seven bits (0 to 127)} |
| 1 | \multicolumn{7}{c\|}{Header value length on fifteen bits<br>(128 to 32,896)} |

Fig. 18

METHODS AND DEVICES FOR ENCODING AND DECODING MESSAGES

CROSS-REFERENCE TO RELATED APPLICATIONS

The application is the National Phase application of PCT Application No. PCT/EP2012/071863, filed on Nov. 5, 2012 and titled "Methods And Devices For Encoding And Decoding Messages." This application claims the benefit under 35 U.S.C. § 119(a)-(d) of PCT Application No. PCT/IB2011/055441, filed on Dec. 2, 2011 and titled "Methods And Devices For Encoding And Decoding Messages." The above cited patent applications are incorporated herein by reference in their entirety.

FIELD OF THE INVENTION

The present invention concerns methods of encoding and of decoding messages, as well as corresponding encoding and decoding devices.

The invention belongs to the field of network communication, and in particular to the field of data compression used when sending messages over a communications network.

BACKGROUND OF THE INVENTION

In messages to be sent there are often lists or groups of items of information that are compressed at the encoder and decompressed at the decoder. This is for example the case for HTTP (standing for Hypertext Transfer Protocol) where HTTP payload is compressed, as well as for SPDY protocol where HTTP headers are compressed.

SPDY is a protocol that intends to improve the well-known HTTP. The SPDY protocol is referred to below to illustrate the present invention, although the invention may apply to other configurations. In particular, it may apply to a large number of data transmission protocols where a list of information items is compressed, such as the above cited HTTP and SPDY protocols.

HTTP is commonly used to request and send web pages, and is based on a client/server architecture, wherein the client sends requests, namely HTTP requests, to the server, and the server replies to the client's requests with responses, namely HTTP responses.

Requests and responses are messages that comprise various parts, among which are non-compressed HTTP headers and compressed HTTP payload.

FIG. 1 represents an example of six HTTP headers that are successively listed in an HTTP request, and then in an HTTP response.

An HTTP header consists of a name (in bold in the Figure) along with a corresponding value.

For instance, in "Host: en.wikipedia.org", Host is the header name, and its value is "en.wikipedia.org". This header is used to indicate the host of the requested resource (for instance, the Wikipedia page describing HTTP, available at http://en.wikipedia.org/wiki/HTTP). HTTP headers are well-known to one skilled in the art, and therefore are not further detailed here.

In the first versions of HTTP, a TCP/IP connection was established for each HTTP request/response exchange.

SPDY is a protocol that improves HTTP in several ways.

First, it enables several HTTP requests and responses to be sent over a unique TCP/IP connection, thus defining a set of HTTP transmissions therein. In this way, all the components of a web page (HTML documents, images, JavaScript, etc.) may share the same TCP/IP connection, thus speeding up the web page loading.

Secondly, SPDY implements compression of the HTTP headers exchanged over the shared TCP/IP connection, using the Zlib Deflate algorithm (also known through the "zip" format). This binary compression reduces the network load.

The Deflate algorithm performs compression of a serialized binary representation of the HTTP headers, by searching (using a sliding window) and replacing duplicate strings of the binary representation with back references thereto, and replacing symbols of the back references with Huffman codes.

A serialized binary representation of the HTTP headers results from the serialization of the HTTP headers as a stream of bits (or bytes).

Compression gains obtained by SPDY are acceptable.

However, speed performance is observed to be poor, while memory consumption may become disadvantageously high.

The poor speed performance is due to the potentially large size of the serialized binary representation, resulting from a large number of headers.

High memory consumption may arise in the case of a HTTP server handling simultaneously a plurality of connections towards a plurality of clients. Independently encoding the headers of the messages transmitted over the different connections requires a large amount of memory, in particular when the number of connections increases: one encoder or compressor is assigned to each connection and a dedicated memory area is reserved for each encoder or compressor.

High memory consumption may arise relatively to constrained devices with low memory resources, for example on decoder side.

In this context, there is a need for a new approach for compressing a list of information items (such as HTTP headers) that achieves similar size reduction while substantially reducing the memory and processing costs. In embodiments, such new approach should be compatible with binary compression such as Deflate, in order to keep high compression performance.

The publication "*A Proposal for Shared Dictionary Compression over HTTP*" (J. Butler et al., 2008) discloses a shared dictionary used to encode cross-payload redundancy by substituting redundancy elements with references to the dictionary. However, the decoder cannot achieve a quick decoding of a large number of encoded elements, using a small amount of memory.

The present invention has been devised to address one or more of the foregoing concerns.

SUMMARY OF THE INVENTION

According to a first aspect of the invention there is provided a method of encoding messages into a bitstream, a message including an initial list of items of information, the method comprising:

determining a first group of indexes associated with information items of the initial list that are already indexed in a local indexing table and a second group of literal values of other information items of the initial list not yet indexed in said local indexing table;

encoding the indexes of the first group;

binary compressing at least a serialized binary representation of the literal values of the second group; and concatenating the first group and the second group together to obtain an encoded bitstream of the information items.

The invention substantially improves the processing speed, for example up to twice as fast as SPDY when the HTTP headers are highly redundant. It may also improve the memory consumption.

This is achieved by indexing items prior to conventional binary compression and grouping based on the indexing step. Indexing allows very fast redundancy search with a limited memory usage at the encoder, while at the decoder, the decoding is rendered more efficient with faster building of the information items.

This is because the indexing technique is based on a highly focused redundancy search while binary compression such as Deflate uses a brute-force exhaustive redundancy search which is slower.

Thus, providing the encoded bitstream wherein the indexes are grouped within the same subpart speeds up processing at the decoder to decode a large number of information items, i.e. of headers, while parsing few encoded data.

According to a second aspect of the invention there is provided a method of decoding encoded messages, the method comprising:

obtaining encoded data from a bitstream, the encoded data comprising a first part concatenated with a second part;

decoding the first part to obtain a first group of indexes associated with information items already indexed in a local indexing table;

binary decompressing the second part to obtain a serialized binary representation of a second group of literal values corresponding to information items not yet indexed in said local indexing table; and providing a decoded list made of the information items indexed by the indexes of the first group and of the information items literally decoded from the second group.

This method provides advantages similar to the above method, but at the decoder. It is to be noted that the information items of the first and second groups are of the same time, for example HTTP headers.

According to a third aspect of the invention there is provided a method of encoding messages to send over a plurality of connections, a message including a list of items of information, the method comprising:

encoding the list of information items of a message using a local indexing table specific to the connection to which the message belongs;

wherein a global table is shared between the connections and comprises items of information; and the local indexing table of each connection associates indexes with references to an entry of the shared global table.

This aspect of the invention optimizes memory consumption. This is because the global table which stores the majority of data (here the information items) is shared between all the connections enabling each information item to be stored only once, while the indexing is specific to each connection providing the shortest indexes for each connection. Thus the global table makes it possible to share the memory cost of the indexing tables between the connections.

Conversely, according to a fourth aspect of the invention there is provided a method of decoding encoded messages received over a plurality of connections, an encoded message including an encoded list of items of information, the method comprising:

decoding the encoded list of information items of an encoded message using a local indexing table specific to the connection to which the encoded message belongs;

wherein a global table is shared by all the connections and comprises items of information; and the local indexing table of each connection associates indexes with references to an entry of the shared global table.

This method provides advantages similar to the above coding method, but at the decoder.

Optional features of the invention are further defined in the dependent appended claims. Below, when discussing certain features with respect to the encoding or compressing, one skilled in the art will easily understand that the corresponding features at the encoder may also be used with respect to decoding or decompressing in the present invention.

According to an embodiment of the invention, at least one of the other information items is encoded by reference to an information item already indexed in the local indexing table, and the literal value of the other information item is representative of a difference between a value taken by the other information item and a value taken by the information item already indexed and used as a reference. This is delta encoding as defined below which is based on partial redundancy between headers (for example header name) to reduce the amount of data required to encode a subsequent header.

In a particular embodiment, a binary sub-part of the serialized binary representation corresponding to the other information item includes, in addition to the literal value of the other information item, an index of the information item already indexed and used as a reference. This is to provide the decoder with the required information for delta decoding.

According to a particular feature, the method further comprises substituting the information item already indexed in the local indexing table with the other information item encoded by reference to the information item already indexed. This provision reduces the increase of the local indexing table as the encoding goes. It thus achieves an efficient management of the memory.

According to another embodiment of the invention, a binary sub-part of the serialized binary representation corresponding to one of the other information items includes, in addition to the literal value of the other information item, a first one-bit flag defining whether the other information item is encoded by reference to an information item already indexed in the local indexing table or not; and a second binary indexing flag defining whether the other information item has to be added to the local indexing table for further indexing or not, This binary design for encoded headers thus provides efficient indexing synchronization between the encoder and the decoder.

In particular, the second binary flag may include a bit to define whether the other information item has to be added to the local indexing table as a new entry or by substitution of the information item already indexed and used as a reference. This contributes to the efficient indexing synchronization, while offering an efficient memory management through the substitution indexing scheme.

According to a particular feature of embodiments of the invention, the binary sub-part includes a binary field to define a length of a common part between a value taken by the other information item and a value taken by the information item already indexed and used as a reference. This is an efficient way to encode part of a value of a header, the encoding of which being made by reference (i.e. partially) to an already indexed header. This is because defining the common part generally saves bits compared to explicitly or literally indicating the values composing that common part. A common part may for example be the first characters (letters or digits) that form the two values being compared.

According to a particular feature, the binary sub-part includes a binary field to define an index corresponding to a name of the other information item in an item name table. Using a name table generally saves memory since it can easily be shared between several indexing tables.

In one embodiment of the invention, the first group of indexes is prior to the second group of literal values in the encoded bitstream. At the decoder, this means that the first part encoding indexes is prior to the second part (of literal values) of the bitstream.

This configuration gives access to a large number of information items with few encoded data to decode by the decoder, for example to access HTTP headers in SPDY. This is because the majority of data representing each indexed information item is stored in the local indexing table and not encoded in the bitstream.

In another embodiment, the step of concatenating generates a serialized binary representation of the concatenated first and second groups, and the step of binary compressing compresses the whole serialized binary representation. A shorter sliding window for binary compression may then be used since the redundancies for the indexes occur more often in the serialized binary representation. A shorter sliding window means memory saving (fewer bits to buffer) as well as processing speed improvement (fewer bits to search through).

In yet another embodiment, the items of information are HTTP headers of an HTTP message. This is the case for SPDY for example.

In particular, an HTTP header is made of at least an HTTP name and an HTTP value, and an indexed HTTP header of the first group comprises an index indexing the HTTP name and comprises the literal HTTP value. This takes advantage of the high redundancy between the HTTP header names (which are generally used in consecutive HTTP messages) while their values may vary highly from one message to another. The same approach may be used for any information item made of a name and a value.

According to a particular feature, an HTTP header is made of at least an HTTP name and an HTTP value, and the method further comprises associating an indexing level flag with an HTTP header, said indexing level flag taking, depending on the HTTP header, either a first full indexing state indicating that the HTTP header has the same HTTP name and HTTP value as the corresponding information item in the local indexing table, or a second partial indexing state indicating that the HTTP header has the same HTTP name as the corresponding information item in the local indexing table but a different HTTP value. This makes it possible to take advantage of the high redundancy of some slowly-varying HTTP headers. For example, it may be advantageous to index a time HTTP header updated each second, since several messages may be sent within a single second. Then for the messages in the following second, the partial indexing state of the flag is used.

In particular, the HTTP header may be an indexed HTTP header of the first group.

According to a particular feature, in case the indexing level flag for an indexed HTTP header is in the second partial indexing state, the different HTTP value of the indexed HTTP header is encoded using a difference between the different HTTP value and the HTTP value of the corresponding information item in the local indexing table.

In another embodiment of the invention, the method further comprises updating the local indexing table by associating, within that local indexing table, at least one information item of the second group with a new index. This makes it possible to feed the local indexing table in such that a new occurrence of the same information item can be indexed.

In particular, the method may further comprise associating, in the encoded stream, an indexing flag with each binary-compressed information item of the second group that is associated with a new index during said updating. This makes it possible to indicate to the decoder an indexing strategy that it may not know.

According to another particular feature, the method may further comprise determining a frequency of occurrence of an item of information of the second group, and deciding to index said item of information in the local indexing table depending on the determined frequency. Thanks to this provision, only the most often occurring items are indexed which leads to an optimized trade-off between memory used to store the local indexing table and processing speed improvement due to the use of indexes.

In yet another embodiment of the invention, the local indexing table associates each index with a reference to an entry of a global table, said entry of the global table comprising the item of information associated with said index. This makes it possible to share the same global table for several connections over which messages are transmitted. In this context, a local indexing table will be used for each connection.

According to a particular feature, the local indexing table comprises at least one item of information indexed by reference to the global table and at least one item of information indexed within the local indexing table alone. A refined indexing strategy may then be implemented that distinguishes certain information items shared by several connections or that are highly frequent (which can be stored by reference to the shared global table) from certain information items specific to a particular connection (which may then be stored within the local indexing table specific to that connection).

In particular, the method may further comprise determining a frequency of occurrence of an item of information, and deciding to index said item of information in the local indexing table alone or by reference to the global table depending on the determined frequency.

According to another particular feature, the global table is shared between a plurality of compressors (corresponding to a plurality of connections) and comprises items of information from messages processed by said plurality of compressors, each compressor having its local indexing table to index, by reference to the shared global table, items of information from messages that it processes. This provision explicitly shows that the global table is shared between the compressors, while the local indexing tables are specific to each compressor.

According to yet another particular feature, determining the first and second groups comprises searching for entries in the global table that correspond to the information items of the initial list and searching, in the local indexing table, for references to the entries found. Such searching is adapted to the use of the shared global table.

According to another embodiment of the invention, the method further comprises choosing between a first encoding of the initial list of information items using said steps of determining, concatenating and binary compressing, and a second encoding of the initial list of information items using only binary compression of a serialized binary representation of the item literal values (i.e. activating or not activating the indexing);

a sliding binary window used for the binary compression of the first encoding being of lower size than a sliding binary window used for the binary compression of the second encoding.

Thanks to this configuration memory use is reduced when using the indexing of information items. This is because thanks to the indexing the redundancies within the serialized binary representation occur more often, such that a shorter sliding window is sufficient to detect those redundancies.

According to yet another embodiment of the invention, the global table is shared between a plurality of network connections and referred to by a corresponding plurality of respective local indexing tables, and the method further comprises, at some point during the encoding, migrating current connections from said shared global table to a new (shared) global table.

This provision of migrating the global table provides saving of memory. This is because, as the messages are exchanged and information items are indexed, the number of indexed information items increases in the shared global table. The migration makes it possible to purge unused indexes from that table, thus saving memory.

That means that the features of the above third aspect of the invention and its optional features may be implemented in the above-defined first aspect of the invention. Conversely, the encoding process defined above in the first aspect of the invention and its optional features may be implemented by some or all the plurality of network connections.

According to a particular feature, the new global table may be created upon receiving a request for a new connection, depending on at least one criterion relating to the currently shared global table (for example the age of that table). It is then decided, as of making this new connection, to work on a new clean global table for that new connection. The new clean global table is a purged version of the previous shared global table.

In particular, the method may further comprise removing entries from the currently shared global table based on the amount of memory used to store both currently shared and new global tables. This makes it possible to comply with memory constraints when using both the new and current global tables before the current global table is abandoned and deleted.

According to another particular feature, migrating current connections is triggered upon receiving a request to end a current connection.

In particular, migrating current connections comprises removing entries used by the current connections from the currently shared global table; adding those removed entries to the new global table; and then deleting said currently shared global table from memory. This provision ensures that the existing indexes are kept for the current connections while freeing memory space.

According to yet another embodiment of the invention, the global table is shared between a plurality of network connections and referred to by a corresponding plurality of respective local indexing tables, each indexed information item in the shared global table being associated with a connection counter that counts the number of connections using that indexed information item, and the method further comprises performing a memory saving operation based on connection counters of the indexed information items.

The use of the connection counter makes it possible to easily detect when an entry (i.e. an indexed information item) of the shared global table is no longer used by any connection. In this situation this entry may be deleted from the table, thus freeing memory space.

In particular, the memory saving operation comprises removing the indexed information item from the shared global table when the corresponding connection counter is zero.

According to another particular feature, the memory saving operation comprises resetting the current connections that use indexed information items associated with connection counters of values lower than a threshold value. This provision aims to free memory space although there may still be connections using the entry (indexed information item) to delete. Thanks to the resetting of these connections, their corresponding indexing tables are re-built from scratch upon the resetting, thus still enabling indexing of the deleted entries.

According to yet another embodiment of the invention, the method may comprise, upon receiving a request to free memory, saving the number of information items indexed in the local indexing table; flushing the global table; and indexing new information items in the local indexing table using indexes starting from the saved number. This provision makes it possible to free memory space while maintaining compatibility with the indexing mechanisms at both the encoder and decoder.

According to another particular embodiment of the invention, the serialized binary representation of the literal values keeps said values according to their relative order in the initial list. This may be implemented when the initial order of the information items is important for the rendering by the decoder.

In particular, the bitstream may comprise additional information storing the order of the information items within the initial list. This makes it possible for the decoder to arrange the information items according to their original order before they are processed.

According to a yet another embodiment of the invention, the message includes a second initial list of items of information, and the encoding method comprises providing a serialized binary representation of literal values of the information items of the second initial list and concatenating it with the encoded bitstream of the information items resulting from the first and second groups. This embodiment thus provided a bitstream wherein a binary part can be read directly by the decoder to obtain quickly headers. Priority headers may thus be included in the bitstream using such list to ensure a quick access thereto to be obtained.

According to a particular feature, the serialized binary representation for the second initial list is prior to the encoded bitstream in the resulting bitstream. Again, this is to obtain the above (priority) headers as soon as possible, in particular when the bitstream is sent through streaming.

Features of some embodiments are now introduced regarding more specifically to the decoding method.

According to an embodiment, at least one of the information items not yet indexed in said local indexing table is decoded by reference to an information item already indexed in the local indexing table, and a corresponding literal value in the second group is representative of a difference between a value taken by the information item not yet indexed and a value taken by the information item already indexed and used as a reference, Again, this is delta encoding as seen from the decoder.

In particular, a binary sub-part of the serialized binary representation corresponding to the information item not yet indexed may include, in addition to the literal value of the information item not yet indexed, an index of the information item already indexed and used as a reference. The decoder can thus fully reconstruct the header.

According to a particular feature, the method further comprises substituting the information item already indexed in the local indexing table with the information item not yet indexed once decoded by reference to the information item already indexed. This provision reduces the increase of the local indexing table as the decoding goes. It thus achieves an efficient management of the memory.

According to another embodiment of the invention, a binary sub-part of the serialized binary representation corresponding to one of the information items not yet indexed includes, in addition to the literal value of the information item not yet indexed, a first one-bit flag defining whether the information item not yet indexed is to be decoded by reference to an information item already indexed in the local indexing table or not; and a second binary indexing flag defining whether the information item not yet indexed has to be added to the local indexing table for further indexing or not, In particular, the second binary flag may include a bit to define whether the information item not yet indexed has to be added to the local indexing table as a new entry or by substitution of the information item already indexed and used as a reference.

According to a particular feature, the binary sub-part includes a binary field to define a length of a common part between a value taken by the information item not yet indexed and a value taken by the information item already indexed and used as a reference.

According to another particular feature, the binary sub-part includes a binary field to define an index corresponding to a name of the information item not yet indexed in an item name table.

These provisions at the decoder provide similar advantages as defined above with respect to the encoder, in particular those of providing an efficient indexing synchronization since indexing indicators are binary defined in the bitstream.

According to a yet another embodiment still regarding decoding of the bitstream, the encoded data obtained from the bitstream comprise a third part concatenated with the first and second parts, wherein the third part is a serialized binary representation of literal values of information items of an additional list.

According to a particular feature, wherein the third part is prior to the first and second parts in the bitstream.

These provisions contributes for the decoder to quickly access some headers since they are located early in the bitstream and easily decoder because not relying on decompression for example.

According to a fifth aspect of the invention there is provided a coding device for encoding messages into a bitstream, a message including an initial list of items of information, the device comprising:
a determining means to determine a first group of indexes associated with information items of the initial list that are already indexed in a local indexing table and a second group of literal values of other information items of the initial list not yet indexed in said local indexing table;
an encoder to encode the indexes of the first group;
a compressor to binary compress at least a serialized binary representation of the literal values of the second group; and
a concatenation module to concatenate the first group and the second group together to obtain an encoded bitstream of the information items.

According to a sixth aspect of the invention there is provided a decoding device for decoding encoded messages, the device comprising:
an obtaining means to obtain encoded data from a bitstream, the encoded data comprising a first part concatenated with a second part;
a decoder to decode the first part to obtain a first group of indexes associated with information items already indexed in a local indexing table;
a decompressor to binary decompress the second part to obtain a serialized binary representation of a second group of literal values corresponding to information items not yet indexed in said local indexing table; and
an output to provide a decoded list made of the information items indexed by the indexes of the first group and of the information items literally decoded from the second group.

According to a seventh aspect of the invention there is provided a coding device for encoding messages to send over a plurality of connections, a message including a list of items of information, the device comprising:
a global table shared between the connections and comprising items of information;
a plurality of local indexing tables corresponding to the plurality of connections, each local indexing table associating indexes with references to an entry of the shared global table;
an encoder to encode the list of information items of a message using the local indexing table specific to the connection to which the message belongs.

According to an eighth aspect of the invention there is provided a decoding device for decoding encoded messages received over a plurality of connections, an encoded message including an encoded list of items of information, the device comprising:
a global table shared between the connections and comprising items of information;
a plurality of local indexing tables corresponding to the plurality of connections, each local indexing table associating indexes with references to an entry of the shared global table;
a decoder to decode the encoded list of information items of an encoded message using the local indexing table specific to the connection to which the encoded message belongs.

Another aspect of the invention relates to a non-transitory computer-readable medium storing a program which, when executed by a microprocessor or computer system in an apparatus, causes the apparatus to perform the steps as defined above.

The coding and decoding devices and the non-transitory computer-readable storage medium may have features and advantages that are analogous to those set out above and below in relation to the methods of encoding or decoding, in particular that of improving the processing speed and of reducing memory consumption when encoding a list of items in a message, such as HTTP headers of HTTP messages.

Another aspect of the invention relates to a method of encoding substantially as herein described with reference to, and as shown in, FIG. 7; FIG. 9; FIGS. 7 and 9; FIGS. 7 and 11; FIGS. 7 and 12; FIGS. 7, 9 and 11; FIGS. 7, 9 and 12 of the accompanying drawings.

Another aspect of the invention relates to a method of decoding substantially as herein described with reference to, and as shown in, FIG. 8; FIG. 10; FIGS. 8 and 10; FIGS. 8 and 11; FIGS. 8 and 12; FIGS. 8, 10 and 11; FIGS. 8, 10 and 12 of the accompanying drawings.

At least parts of the method according to the invention may be computer implemented. Accordingly, the present invention may take the form of an entirely hardware embodiment, an entirely software embodiment (including firmware, resident software, micro-code, etc.) or an embodiment combining software and hardware aspects which may all generally be referred to herein as a "circuit", "module" or "system". Furthermore, the present invention may take the form of a computer program product embodied in any tangible medium of expression having computer usable program code embodied in the medium.

Since the present invention can be implemented in software, the present invention can be embodied as computer readable code for provision to a programmable apparatus on any suitable carrier medium, for example a tangible carrier medium or a transient carrier medium. A tangible carrier medium may comprise a storage medium such as a floppy disk, a CD-ROM, a hard disk drive, a magnetic tape device or a solid state memory device and the like. A transient carrier medium may include a signal such as an electrical signal, an electronic signal, an optical signal, an acoustic signal, a magnetic signal or an electromagnetic signal, e.g. a microwave or RF signal.

BRIEF DESCRIPTION OF THE DRAWINGS

Embodiments of the invention will now be described, by way of example only, and with reference to the following drawings in which:

FIG. 1 illustrates six HTTP headers for respectively an HTTP request and an HTTP response;

FIGS. 2a, 2b, 2c and 2d illustrate a SPDY example in which the principle of the invention is implemented;

FIGS. 4a and 4b illustrate two different implementations of local indexing tables, respectively built independently and built with reference to a global table;

FIG. 13 schematically illustrates various encoded bitstreams that can be obtained using the invention; and FIGS. 14 to 18 show binary representations for encoding headers according to various embodiments of the invention, wherein FIG. 14 shows a binary representation for a header encoded using an index from an indexing table;

FIG. 15 shows a binary representation for a header that is literally encoded;

FIGS. 16 and 17 shows binary representations for headers that are delta encoded, respectively without and with indexing; and FIG. 18 partially shows a binary representation for a header value that is literally encoded.

DETAILED DESCRIPTION OF EMBODIMENTS OF THE INVENTION

Referring to FIG. 1, first part of the information items, here HTTP headers, may be indexed and/or compressed using the Deflate compression as explained below and second part of the information items may be converted into a serialized binary representation of literal values and then input to the bitstream without indexing and compression.

Where the whole first part of information items is compressed, the second part of information items may also include a serialized binary representation of headers that are fully or partially indexed as described below, but without compression.

The absence of compression for the second part advantageously gives the decoder (e.g. an HTTP proxy server) an easy and quick access to some HTTP headers. The headers of the additional initial list made of the information items not compressed can be specified in a predefined list, for example based on the header names. For example, the headers "HTTP Method", "HTTP Version" and "Status" (not shown) can advantageously be part of such additional initial list.

Below a binary representation for headers is described with reference to FIGS. 14 to 18.

In the encoded bitstream, the serialized binary representation of the additional initial list may be concatenated, in particular prior to, with an encoded and compressed bitstream corresponding to the first part of the information items once encoded and/or compressed.

The left part of FIG. 2 shows the conventional SPDY for a server having three connections and performing independent Deflate compression (ZIP1, ZIP2 and ZIP3) of HTTP headers to three clients (FIG. 2a), as well for a client having three connections to receive HTTP messages and performing independent decompression (FIG. 2c).

The right part of FIG. 2 illustrates an embodiment of the present invention: prior to the three independent Deflate steps (ZIP1, ZIP2 and ZIP3), header indexing is performed based on a shared global table (FIG. 2b). Corresponding header indexing is performed at the decoder (FIG. 2d).

This makes it possible to lighten the Deflate steps, since fewer bytes are compressed or decompressed using Deflate, thanks to the previous indexing. Furthermore, the global table shared by the connections for header indexing enables indexing memory costs to be shared also.

Figure 3:
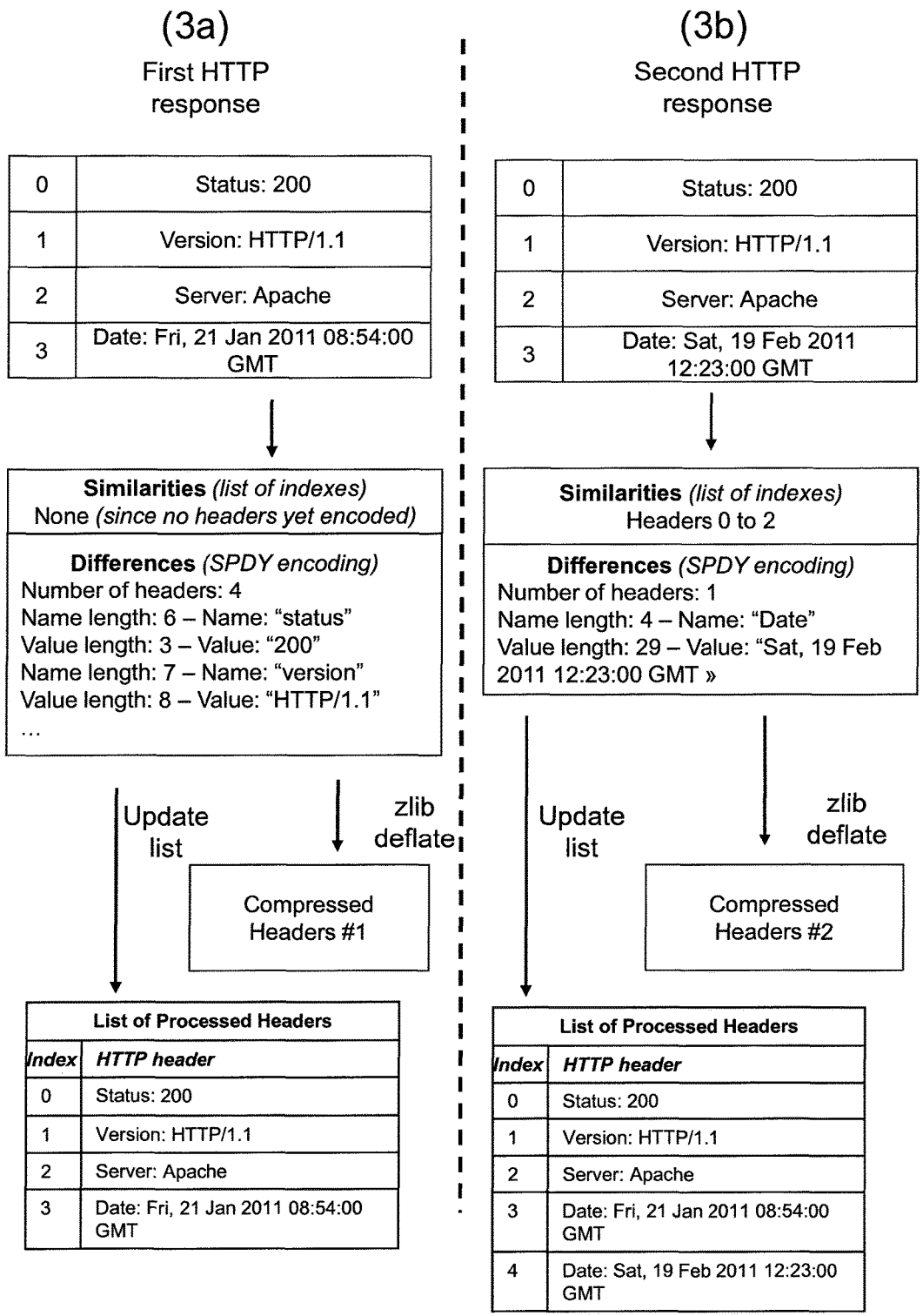
FIG. 3 illustrates an example of header indexing in addition to the Deflate compression for two successive HTTP responses of a SPDY connection, according to the present invention.

FIG. 3 illustrates the header indexing in addition to the Deflate compression for two successive HTTP responses of a SPDY connection. This concerns the first part of the headers when a second part of headers to not index or compress is provided. FIG. 3a shows the situation for the first response and FIG. 3b for the second response which occurs later on.

The four HTTP headers of each response are represented at the top of the Figure.

Regarding the first response in the SPDY connection, since no header has been already processed and indexed, no similarity is found with a previous response and thus all four HTTP headers are encoded literally with the standard SPDY encoding: the name of each HTTP header is first encoded literally or indexed with reference to a header name table, followed by its value encoded literally. An example of binary representation of such encoding is described below with reference to FIGS. 15 and 18.

The processor then applies the Deflate compression to the encoded stream (i.e. a serialized binary stream) to obtain the compressed header stream that is transmitted over the network in the HTTP response.

In parallel, the four HTTP headers are stored in the list of processed headers for later indexing reuse. This list is the local indexing table having possibly (in some embodiments) references to the above-mentioned global table. In this example, the local indexing table for the SPDY connection associates each HTTP header with a specific index.

Regarding the second response which occurs later than the first response in the SPDY connection, the four HTTP headers are also processed. Three of them are exactly the same as the first three headers of the first response and are already stored in the local indexing table.

The corresponding three indexes, for example respectively 0, 1 and 2 as shown in the Figure, are retrieved from the local indexing table to encode the first three HTTP headers. This constitutes a first list or group of indexes. An example of binary representation of each encoded index is described below with reference to FIG. 14.

Next, the remaining HTTP header is encoded literally using the SPDY encoding since it cannot be encoded as an index. This constitutes a second list or group of literal values, the serialized binary header stream of which is then compressed using the Deflate compression before being sent over the network in the second response, concatenated with the first list or group.

For the following, reference will be made to the first and second lists while a reference to groups can also be made as provided above.

Again, in parallel to sending the compressed headers, the local indexing table is updated by adding a new entry matching the literally-encoded header with a new index (index 4), so that it can be used to encode efficiently (with that index) redundancies in subsequent responses.

In embodiments described below, each remaining HTTP header forming the second list may be delta-encoded, i.e. encoded by reference to a header already indexed in the local indexing table. In this example, the fourth entry of the table (with index equal to 3) has the same header name (namely "Date"), and thus reference to this entry can be used, where a difference between the value taken by the remaining HTTP header and the value taken by this entry is then encoded literally. A resulting binary representation thus includes the index used and the literal value of the difference. An example of such binary representation is given below with reference to FIGS. 16 to 18.

In a variant, the value taken by the remaining HTTP header can be directly encoded literally instead of the difference.

In the situation where delta-encoding is used, a variant to adding a new entry matching the encoded header with a new index may consist in substituting the entry used as reference with the remaining HTTP header that has just been encoded, Criterion to decide between the two kinds of updating (incremental or by substitution) may be based on statically-defined strategies based on the header names for instance.

The binary representation of FIGS. 16 to 18 thus includes a bit to define whether the remaining HTTP header has to be added to the local indexing table as a new entry or by substitution of the header already indexed and used as a reference.

As is apparent from the above example of FIG. 3b, the header indexing allows processing improvements over SPDY encoding due to the reduced amount of bits that is Deflate compressed. A processing speed improvement up to twice faster can also be obtained for HTTP headers of subsequent HTTP messages, if there is high redundancy between those headers.

Of course, universal lossless compression techniques other than Deflate, such as LZW or BZIP2, can be used instead of the Deflate compression utilized here for illustrative purposes. Also, the invention applies to any list of information items in messages, the HTTP headers being one illustrative example.

In addition, due to the header indexing according to the invention which reduces the size of the binary stream to compress, the Deflate sliding window size of each connection may be reduced, thus saving both memory (less bytes to buffer) and speed (less bytes to search through). This is because the header indexing approach with a very small additional memory cost continues to improve the speed in that situation but also enables the compression ratio achieved for larger sliding window size to be maintained.

For example, when the sliding window size is made smaller than the number of bytes used to represent the HTTP headers of a message, some redundancies are not detected by the Deflate compression thus resulting in a decreased compression. To illustrate, if the same header A occurs in two successive messages, header A will be added to the current sliding window during the encoding of the first message but may be removed from the sliding window before starting the encoding of the header A of the second message (if the window is too short). Therefore, fewer redundancies may be actually retrieved leading to a decrease in the compression efficiency.

This is however compensated by the header indexing since an indexed header is continuously kept in the indexing table, thus still enabling redundancies to be detected.

Furthermore, header indexing makes it possible to give faster access to HTTP headers at the decoder. This is because, thanks to the indexes, few bits or bytes need to be parsed and then accessed from the encoded bitstream and decoded to obtain the corresponding HTTP headers (stored in the local indexing table). This is particularly true when the first list of indexes is prior to the second list of literal values in the encoded bitstream.

In addition to these speed and compression benefits, memory savings can be obtained by efficiently implementing the local indexing tables for several contemporaneous connections.

FIG. 4a illustrates a first example of implementation of local indexing tables for a first connection ("#1" above) and a second connection ("#2" below). The entirety of each HTTP header encountered during the encoding of HTTP messages is added to the local indexing table specific to the connection to which the message belongs. This may result in storing the same HTTP headers twice (e.g. "Status: 200 OK") and in a total memory cost of 155 bytes.

FIG. 4b shows a memory cost-reducing implementation of the same indexing. A global table as introduced above is used to store the HTTP headers and to associate with them references (A, B, etc.). The local indexing tables thus just associate indexes with references of the global table. This substantially reduces the memory costs, as shown by the resulting cost of 132 bytes compared to the cost of 155 bytes of FIG. 4a.

The saving in memory space is about 23 bytes.

While references are stored within the global table in the Figure, a variant may comprise storing, within the local indexing tables, pointers to the entries of the global table, each entry only storing the HTTP headers.

Figure 5:
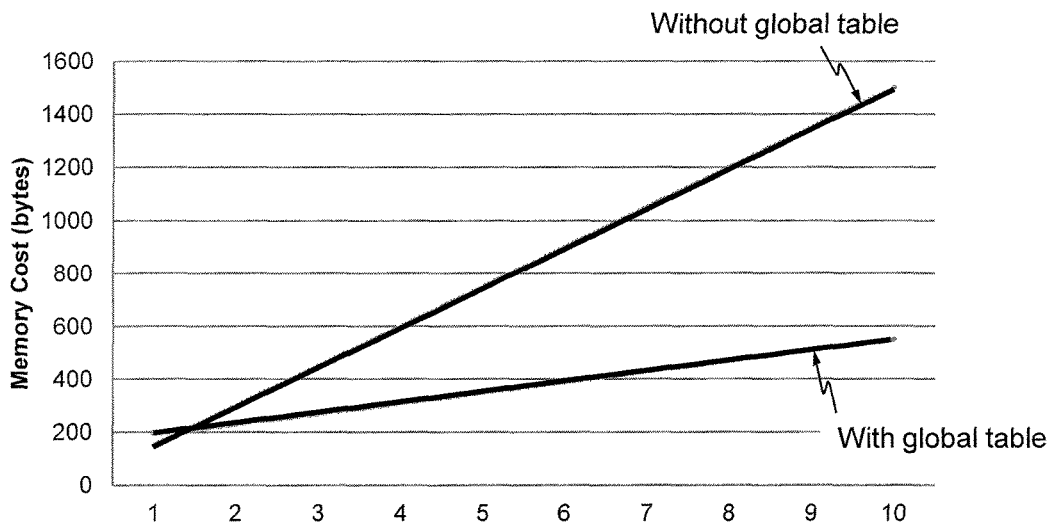
FIG. 5 is a plot illustrating the memory space used for storing local indexing tables according to the two approaches of FIGS. 4a and 4b.

FIG. 5 shows the difference in memory space used for these two approaches (independent indexing tables versus reference to a global table), depending on the number of connections. It is clear from that Figure that as the number of connections (i.e. of local indexing tables) increases, the memory savings obtained by using the global table increase. This is because the more connections there are, the more often a single string is used by several connections and thus indexed in several local indexing tables.

Regardless of whether the local indexing tables is implemented independently or with references to the global table, the corresponding costs in memory for their storage is substantially compensated by the memory savings achieved by reducing the Deflate sliding window size for all the connections.

Figure 6:
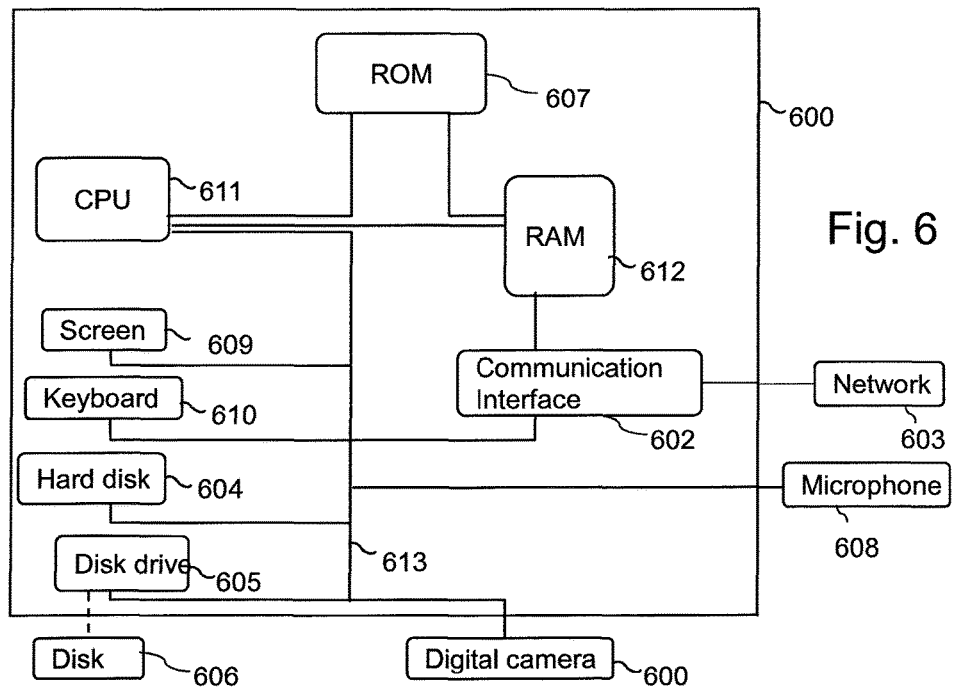
FIG. 6 is a block diagram illustrating components of a processing device in which embodiments of the invention may be implemented.

FIG. 6 schematically illustrates a processing device 600, either a transmitter, or a receiver, or a device embedding both functionalities, configured to implement at least one embodiment of the present invention. The processing device 600 may be a device such as a micro-computer, a workstation or a light portable device. The device 600 comprises a communication bus 613 to which there are preferably connected:

- a central processing unit 611, such as a microprocessor, denoted CPU;
- a read only memory 607, denoted ROM, for storing computer programs for implementing the invention;
- a random access memory 612, denoted RAM, for storing the executable code of the method of embodiments of the invention as well as the registers adapted to record variables and parameters necessary for implementing methods according to embodiments of the invention; and
- a communication interface 602 connected to a communications network 603 over which digital data to be processed are transmitted.

Optionally, the apparatus 600 may also include the following components:

- a data storage means 604 such as a hard disk, for storing computer programs for implementing methods of one or more embodiments of the invention and data used or produced during the implementation of one or more embodiments of the invention;
- a disk drive 605 for a disk 606, the disk drive being adapted to read data from the disk 606 or to write data onto said disk;
- a screen 609 for displaying data and/or serving as a graphical interface with the user, by means of a keyboard 610 or any other pointing means.

The apparatus 600 can be connected to various peripherals, such as for example a digital camera 600 or a microphone 608, each being connected to an input/output card (not shown) so as to supply multimedia data to the apparatus 600.

The communication bus provides communication and interoperability between the various elements included in the apparatus 600 or connected to it. The representation of the bus is not limiting and in particular the central processing unit is operable to communicate instructions to any element of the apparatus 600 directly or by means of another element of the apparatus 600.

The disk 606 can be replaced by any information medium such as for example a compact disk (CD-ROM), rewritable or not, a ZIP disk or a memory card and, in general terms, by an information storage means that can be read by a microcomputer or by a microprocessor, integrated or not into the apparatus, possibly removable and adapted to store one or more programs whose execution enables a method according to the invention to be implemented.

The executable code may be stored either in read only memory 607, on the hard disk 604 or on a removable digital medium such as for example a disk 606 as described previously. According to a variant, the executable code of the programs can be received by means of the communication network 603, via the interface 602, in order to be stored in one of the storage means of the apparatus 600, such as the hard disk 604, before being executed.

The central processing unit 611 is adapted to control and direct the execution of the instructions or portions of software code of the program or programs according to the invention, which instructions are stored in one of the aforementioned storage means. On powering up, the program or programs that are stored in a non-volatile memory, for example on the hard disk 604 or in the read only memory 607, are transferred into the random access memory 612, which then contains the executable code of the program or programs, as well as registers for storing the variables and parameters necessary for implementing the invention.

In this embodiment, the apparatus is a programmable apparatus which uses software to implement the invention. However, alternatively, the present invention may be implemented in hardware (for example, in the form of an Application Specific Integrated Circuit or ASIC).

Various embodiments of encoding and decoding methods according to the invention are now described with reference to FIGS. 7 to 12. A network node may embed one of or both encoding and decoding capabilities.

If the node operates as both encoder and decoder, preference is given to the use of two distinct local indexing tables for respectively the encoding and the decoding within the same connection. Similarly, two global tables and two (extra) header name tables as described below may be used. This is because the headers of HTTP requests are generally different from the headers of HTTP responses. Each local indexing table is then handled independently from the other for the same connection.

However, one skilled in the art may understand that it is still possible to use a single local indexing tables for the encoding and decoding tasks, in particular if it is observed that an large number of HTTP headers are similar within the requests and the responses of the same connection.

Figure 7:
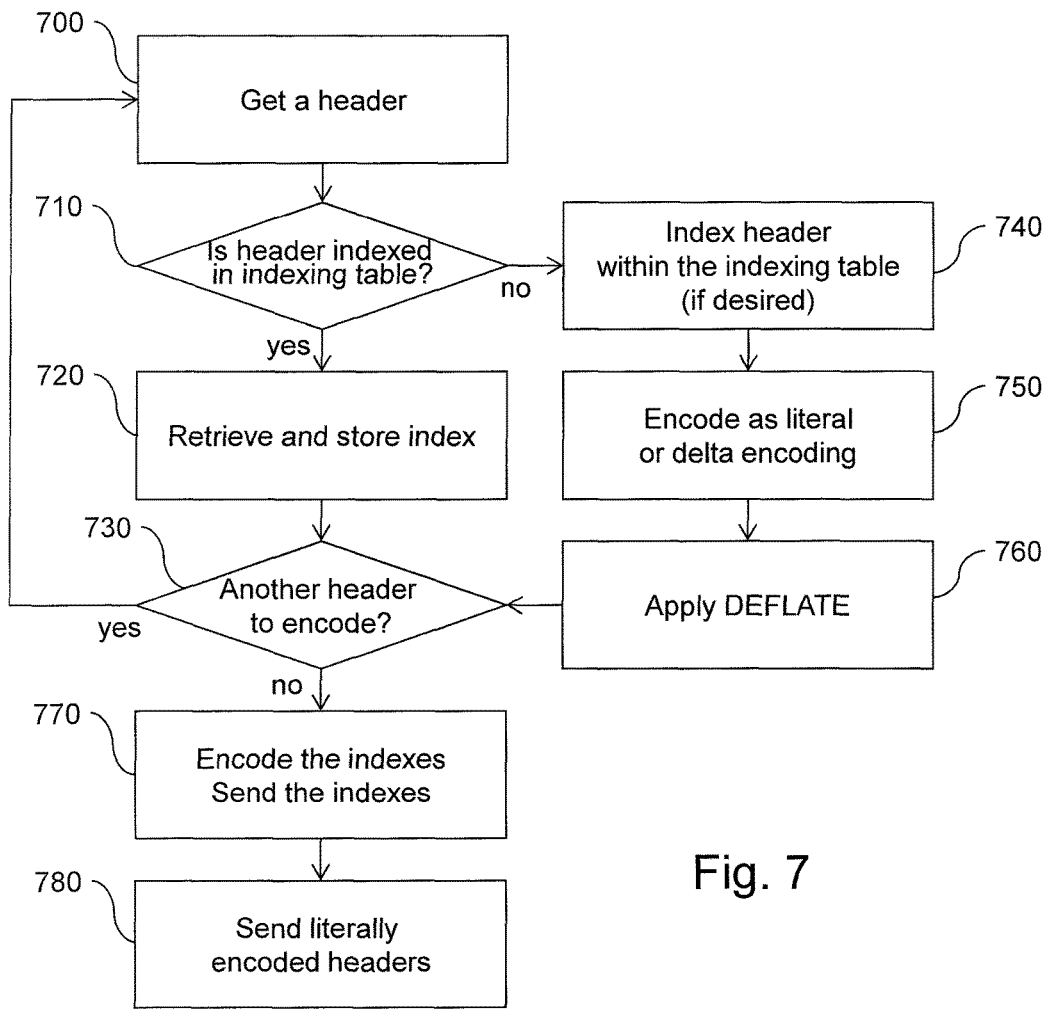
FIG. 7 is a flowchart illustrating general steps of an HTTP header encoding process according to one embodiment of the invention.

FIG. 7 is a flowchart illustrating general steps of an HTTP header encoding process according to one embodiment of the invention. It is recalled here that a plurality of HTTP headers have to be encoded when processing an HTTP message according to SPDY. Any kind of information items other than HTTP headers can be implemented.

In the described process, only one connection is considered. Of course, the same process may be performed simultaneously by other encoders that operate for other connections. It is also made reference to the encoding of HTTP headers where the initial order of the headers is not significant and important for the decoder. When such initial order should be kept by the decoder (i.e. retrieved since the invention may possibly modify this order for the transmission), the invention may provide, within the stream, additional information (e.g. an additional header) storing the initial order of the headers. For example, this additional information may define the exact position of each indexed header within the initial order, while the other headers (i.e. without indexing) are literally encoded keeping their relative initial order.

Here, the headers that are indexed and/or binary compressed are considered. The headers that are only serialized into a binary representation before being inserting in the encoded bitstream are processed as explained above using the binary representations described below with reference to FIGS. 14 to 18.

The process starts by iterating on each HTTP header of the message to encode, as shown by the loop between steps 700 and 730.

For each header, a search is made in the local indexing table specific to the current connection to determine whether or not the header is already indexed (step 710).

This search may consist in determining whether or not the HTTP header is already present in the local indexing table, when using tables as in FIG. 4a.

When using a global table as shown in FIG. 4b, this search comprises searching for an entry in the global table that corresponds to the header and searching, in the local indexing table, for reference to the entry found.

If the header is already indexed, its index is retrieved from the local indexing table and is stored in a first list (step 720). This first list (or group) is built to include the indexes of the message headers that are already indexed in the local indexing table.

Figures 13, 14, 15:
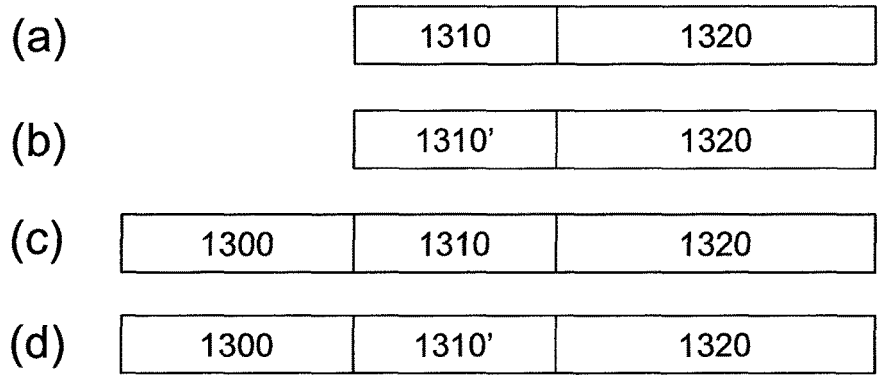

On the contrary, when the header is not yet indexed, a first step 740 is performed to decide whether the header has to be indexed in the local indexing table or not, and to index that header in the local indexing table (possibly with reference to the global table if appropriate) in case of positive decision. A criterion for such decision may be based on the memory space available at the encoder, compared for example to a predefined maximum memory space. All the headers may be indexed until the predefined maximum memory space is reached by the local indexing table (and any other tables involved as described above and below). An information representative of such decision (i.e. whether or not the header must be indexed) is provided in the binary representation of the encoded header as shown in FIGS. 15 to 17. This is to ensure the decoder to be synchronized with the encoder when building the local indexing table.

More specific strategy may restrict the indexing of headers processed to only the headers having a size less than a threshold (e.g. 256 characters).

Then, in a second step 750, the header is encoded. Two possibilities are considered.

Search is performed in the local indexing table (including possibly the global table) for an entry having the same header name as the current header being processed. In case where such an entry is found (if several entries are found, the entry having the most similar value is selected), it is used as a reference to delta encode the current header. In other words, the current header is encoded into a set of data comprising the index of the selected entry in the local indexing table (the reference) and the difference between the value taken by the selected entry and the value taken by the current header.

As shown below with reference to FIGS. 16 and 17, the difference may consists in a first data indicating a common part between the two considered values (for example a number of similar first characters between two strings) and a second data including the literal value of the remainder of the value (i.e. the value of the current header less the common part). In case the two values are numbers (integer, floats, etc.), the difference may only consists in a value representing the numeral difference between the two values.

In case where such an entry is not found or if no delta encoding is implemented, the current header is encoded literally.

A compression algorithm such as Deflate is then applied to a binary representation of the set of data or of the literal value (step 760). FIGS. 15 to 18 described below show binary representations of the various cases.

Step 740 updates the local indexing table by associating, within that local indexing table, at least one literally-encoded header with a new index or a delta-encoded header with a new index or in replacement of the already-indexed header used as a reference for the delta encoding.

In the incremental indexing mode (i.e. by addition of a new entry), the encoded header is appended to the local indexing table, its index being equal to the number of headers already in the table prior it was appended to it.

In the substitution indexing mode (i.e. in replacement of the entry used as a reference), the encoded header includes a reference to a header already indexed in the local indexing table and replaces that header in the local indexing table.

In case of delta-encoding when step 740 decides to index the header being currently encoded, the encoder has also to decide between incremental indexing and substitution indexing. Such decision can be based on statically-defined strategies based on the header names for instance.

An information representative of such decision (i.e. incremental indexing or substitution indexing) is provided in the binary representation of the delta-encoded header as shown in FIGS. 16 and 17. This is to ensure the decoder to be synchronized with the encoder when building the local indexing table.

The Deflate context is kept between each processed header at step 760 so that the encoding result is the same as applying the Deflate compression on the serialized binary representation of all the literal values (possibly appended to index of a reference header and common part definition in case of delta encoding) determined at the occurrences of step 750. One skilled in the art would then understand that the literal values (appended to index and common part definition) may be stored in a second list and then the Deflate compression may be performed on the serialized binary representation of that second list when exiting the loop 700-730. The serialized binary representation of that second list may be the concatenation of a binary representation of each header processed according to step 750. Such binary representation for each header is described below with reference to FIGS. 15 to 18.

Once all the headers have been processed through steps 700-750, the next step consists in encoding the indexes of the first list built at the occurrences of step 720. Such encoding may consist in obtaining a binary representation of the indexes. The indexes are encoded (i.e. converted into binary representation) either as single values or as ranges of values. An example of binary representation for the index encoding a header is described below with reference to FIG. 14.

A compression technique like Deflate can also be used on the binary representations. In that case, the serialized binary representation for the first list and the serialized binary representation for the second list can be concatenated together and binary compressing may be performed on the whole resulting serialized binary representation to compress it.

Once encoded, the serialized binary representation of the first list is sent at step 770. The number of indexed headers can be typically encoded first and then each index, although a dedicated code may be defined to flag the end of the index header section in a variant.

Next the compressed serialized binary representation of the second list is also sent at step 780.

For example, the first list of header indexes may be concatenated with the second list of literal values so that the resulting list is sent (after appropriate coding and compression) to perform both steps 770 and 780.

The processing savings of this process (and then of the corresponding decoding process) comes from the fact that the cost for building and searching within the local indexing table is more than compensated by the savings due to not applying the Deflate compression to each indexed header.

Of course, the more headers which are indexed, the higher the processing savings. Furthermore, the added memory consumption is limited since the memory used to store the local indexing table may be compensated by decreasing the Deflate sliding window size.

In the examples of FIG. 4a and FIG. 4b the whole HTTP header is indexed as a single entry in the local indexing table. However, other indexing strategies or decision rules may be implemented when performing the indexing step 740: for example indexing the whole header, part of the header, or not indexing the header at all depending on criteria.

According to one indexing strategy, the header names may be indexed separately from header values. In particular, header name indexing (i.e. indexing the header name) will generally be favoured over header value indexing (i.e. indexing the header value) since header names are generally more redundant than their values. For example, the 'Date' HTTP header value evolves over time and may advantageously not be indexed while the 'Date' HTTP header name may be indexed since it remains unchanged over time. Similar consideration can be used for other HTTP headers according to their nature, for example for 'Age' or 'Content-Length' headers.

When favoring the header name indexing, an HTTP header may be encoded into an index indexing the HTTP name and a literal HTTP value. This is the delta encoding as introduced above.

Delta encoding is preferably applied to headers forming the second list since a difference value is literally encoded as explained below. In another embodiment, delta encoding is applied to headers forming the first list since they are encoded using indexes.

As one knows, memory may constitute a constraint for building the local indexing table (and global table when used). Thus, it may be decided to limit the memory size used by the indexing table, in particular by limiting the number of table entries or the memory size allocated to store the header representations. Typically, an indexing table can be limited to a buffer of 512 bytes or 1024 bytes. In that case, the decision of whether or not to index a new header (or part of it) at step 740 can be taken based on the proportion of allocated memory that is already used.

With such a limited buffer size, the additional memory cost is limited and the results are generally improved by indexing at step 740 only the header having a small binary representation, typically headers with less than 64 characters.

A refinement of that approach may comprise incrementally indexing headers with large binary representation. In other words, the header is incrementally indexed as several occurrences of that headers occur and are processed.

For example, the first time that header with large binary representation is encountered, only the first N characters (N=64 for instance) are actually stored in the indexing table and associated with an index. For that first occurrence, the remaining characters are encoded literally. The second time the same header (second occurrence) is encountered, the indexing table is updated by increasing the number of characters to store (for instance 2N) for the same index, and so on until the whole header is stored if it occurs enough times.

According to another strategy, an indexing flag may be associated with each binary-compressed literal header to indicate that it has to be indexed in the local indexing table. The decoder can therefore be informed of any proprietary indexing strategies that it does not already know. For example, the literal encoding of the header includes a flag telling the decoder whether to add the header in the indexing table.

Proprietary strategies may cover various situations, for example the knowledge by the encoder of a precompiled list of header names to index (header name table) or a precompiled list of header names not to index.

The list could for instance contain the headers that can be shared between several connections. Typically headers related to cookies may advantageously not be shared between several connections and may advantageously not be indexed. The 'Set-Cookie' header may advantageously not be indexed since its value is expected to change. In any case, headers that are not indexed will generally be efficiently compressed by the Deflate compression step 760.

Another indexing strategy may be based on the fact that some headers have a limited validity over time. This is for example the case of the "Date" header, which contains the date at which a message is sent, but with a precision to the second.

Since a computer is able to send many messages during one second, indexing such a date-based header can be efficient. But this will be useful only for a few messages produced within the same second. Several messages can be emitted quickly by a client to fetch all the resources relating to a Web page (style, JavaScript, images . . . ), or by the server when responding to the client.

To support limited validity over time, a new header may be flagged as delta indexed, which means giving, in addition to the index, information about the difference (in second in the example) relative to the header corresponding to the index. This is already introduced above.

In that case, an indexing level flag is associated with an HTTP header, said indexing level flag taking, depending on the HTTP header, either a first full indexing state indicating that the HTTP header has the same HTTP name and HTTP value as the corresponding information item in the local indexing table, or a second partial indexing state indicating that the HTTP header has the same HTTP name as the corresponding information item in the local indexing table but a different HTTP value. The difference in value may be also literally encoded and transmitted.

As introduced above, this may apply either to headers of the first list or to headers of the second list.

The "partial indexing state" thus indicates to the decoder that the header value difference has to be decoded literally.

Also as described in the above example of FIG. 7, the indexed headers are prior to the literally and delta encoded headers within the encoded bitstream. This provides some advantages.

For example, some headers may be notably important for network nodes to dispatch the messages to the right processing entity, like the URL value of the HTTP requests. Also, HTTP caching headers are useful for proxies. These headers are generally very redundant and are therefore quickly indexed. Providing first the indexed headers allows in most cases network nodes to get access quickly to the most important headers without having to use Deflate decompression and header string parsing techniques. Furthermore, decoding the indexed headers can be done by retrieving few bytes from the bitstream, thus making it possible to obtain a large number of decoded headers by accessing a small part of the bitstream.

However, variants can be used. For example, to limit the buffering needed, the literally and delta-encoded headers can be sent first as a Deflate stream and then the indexed headers be sent. In that case, a specific code ends the literally and delta-encoded header section so that it allows the decoder to quickly switch to the index-encoded header section.

Also as described above, a third set of headers that are neither indexed nor compressed (e.g. Deflate) may also be inserted in the encoded bitstream prior to the indexed headers and the literally and delta-encoded headers. This is to provide an easy and quick access to some headers for the decoder, since no search in the local indexing table nor binary Deflate decompression is required.

FIG. 7 also illustrates an example of processing where index encoding is separated from literal/delta encoding. While this allows improved compression, it also only requires a small amount of buffering for the indexes and/or the literal values. According to a variant, the headers may be encoded and sent as soon as they are processed.

Finally, a flag can be encoded as part of each literally and delta-encoded header to indicate to the decoder that the header must be added to the index table. An alternative is that both encoder and decoder know the indexing rules exactly so that they will keep their indexing table synchronized without the need to communicate the indexing decision information.

FIG. 13 schematically illustrates various encoded bitstreams that can be obtained using the invention.

In FIG. 13a, the bitstream comprises a first binary part 1310 including a serialized binary representation of the indexes of the first list and a second binary part 1320 including the (Deflate) compressed serialized binary representation of the headers of the second list. In this embodiment, the serialized binary representation of the indexes of the first list has not be (Deflate) compressed. Of course, according to a variant, the first and second binary parts may be inverted.

In FIG. 13b, the bitstream comprises a first binary part 1310' including a (Deflate) compressed serialized binary representation of the indexes of the first list and a second binary part 1320 including the (Deflate) compressed serialized binary representation of the headers of the second list. The serialized binary representations for the two lists are concatenated before being (Deflate) compressed. Of course, according to a variant, the first and second binary parts may be inverted.

The cases of FIGS. 13c and 13d are similar to the cases of FIGS. 13a and 13b but with an additional binary part 1300 concatenated to the first and second binary parts that includes a serialized binary representation of headers that are neither (Deflate) compressed nor indexed. Of course, according to a variant, the additional binary part may take another location in the bitstream relatively to the first and second binary parts.

Figure 8:
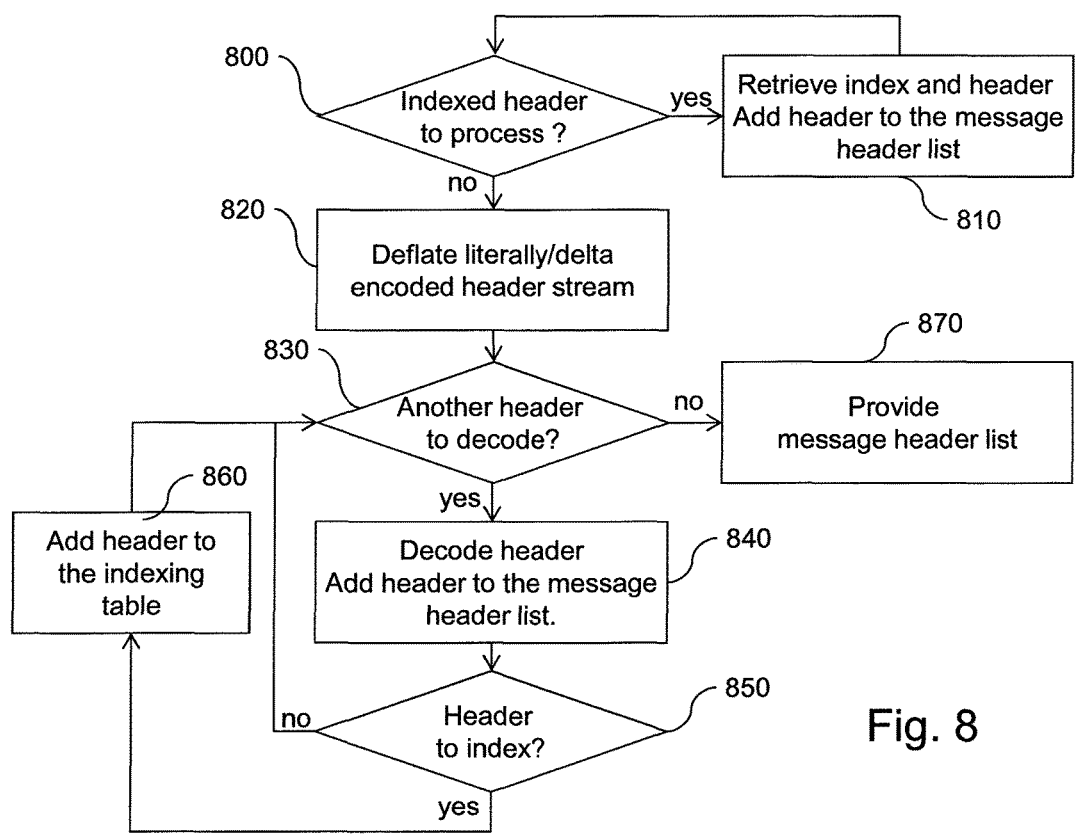
FIG. 8 is a flowchart illustrating general steps of an HTTP header decoding process according to one embodiment of the invention.

FIG. 8 is a flowchart illustrating general steps of an HTTP header decoding process according to one embodiment of the invention. In particular it is the decoding process corresponding to the encoding process of FIG. 7.

This means that the decoder operates in a similar fashion to the encoder. For example, the same indexing strategy is used by both the encoder and the decoder in such a way that they have the same local indexing tables and the same global table when used.

Similarly to the encoding process, a plurality of headers has to be processed when decoding. In the example of the Figure, the encoded indexed headers are obtained prior to the literally and delta-encoded headers.

A preliminary step (not shown) may consist in parsing and reading a first part of the bitstream including the headers that have been serialized only, i.e. not encoded nor binary compressed. This preliminary step provides a first set of headers added to the message header list.

The first step in FIG. 8 consists in decoding indexed headers through steps 800 and 810.

The algorithm starts at step 800 by checking whether there is a remaining indexed header to decode. This test may be either based on decoding the number of headers or decoding a code or flag telling whether there is a remaining header to decode.

Each time an indexed header is to be decoded, the decoder decodes the header index from the bitstream using the local indexing table (step 810). The header index may be read from the binary representation as shown in FIG. 14. The header is retrieved from the indexing table using its index decoded from the bitstream.

The decoded header is then added to the message header list.

This decoding step is fast and simple since no header parsing (separation of header name and header value, parsing of the header value in dedicated structures) is actually required. Thus header decoding speed is improved.

When all indexed headers have been decoded, the literally/delta-encoded section of the bitstream is decompressed using the Deflate algorithm (step 820) and the obtained binary stream is parsed to process each literally or delta-encoded header (steps 830 to 860).

The decoding starts by checking whether binary data remains to decode from the decompressed binary stream (step 830).

If so, the next encoded header is decoded from the decompressed binary stream by retrieving the header name and its value (step 820). Flags in the binary representation of the encoded header as shown in FIGS. 15 to 17 help the decoder to determine whether the encoded header has to be delta decoded (i.e. partly by reference to a header already indexed in the local indexing table) or has to be literally decoded.

If delta encoded, the header is decoded by retrieving the header name from the reference header in the local indexing table and by obtaining the difference value.

Once parsed or decoded, the obtained header is added to the message header list.

A test is then carried out to check whether this obtained header has to be indexed or not (step 850). The decoder implements the indexing strategy decided by the encoder, based on the generated bitstream information. In the particular case where the encoder has added an indexing flag to the bitstream (see corresponding flags in FIGS. 15 to 17), that flag is searched for by the decoder in the bitstream to determine whether or not the decoded header has to be indexed, and, if any, according to which indexing mode between incremental and substitution indexing.

If it has to be indexed, the decoded header is added to the local indexing table (step 860) as a new entry (incremental indexing) or in replacement of the entry used as a reference in the delta decoding (substitution indexing).

Otherwise or after this indexing step 860, following binary data to decode are considered at step 830.

Once all headers have been decoded, the full message header list is provided to an application that will process it (step 870). Of course, if an order of the headers has been specified in the encoded bitstream, the message header list is reordered according to said order before being provided to the application.

As introduced above, some indexing strategies enable certain header representations to be shared between different connections of the same network node, be it decoder or encoder, through the global table. This enables a decrease in the memory cost of the local indexing tables used by the different connections at a limited processing cost: a global header table is defined for the pool of connections and may store all indexed headers. Next, for each connection, a specific indexing table stores references to the exact headers that have been indexed for that given connection.

FIG. 4b illustrates such a strategy with a shared global table and two local indexing tables for two corresponding connections.

Figure 9:
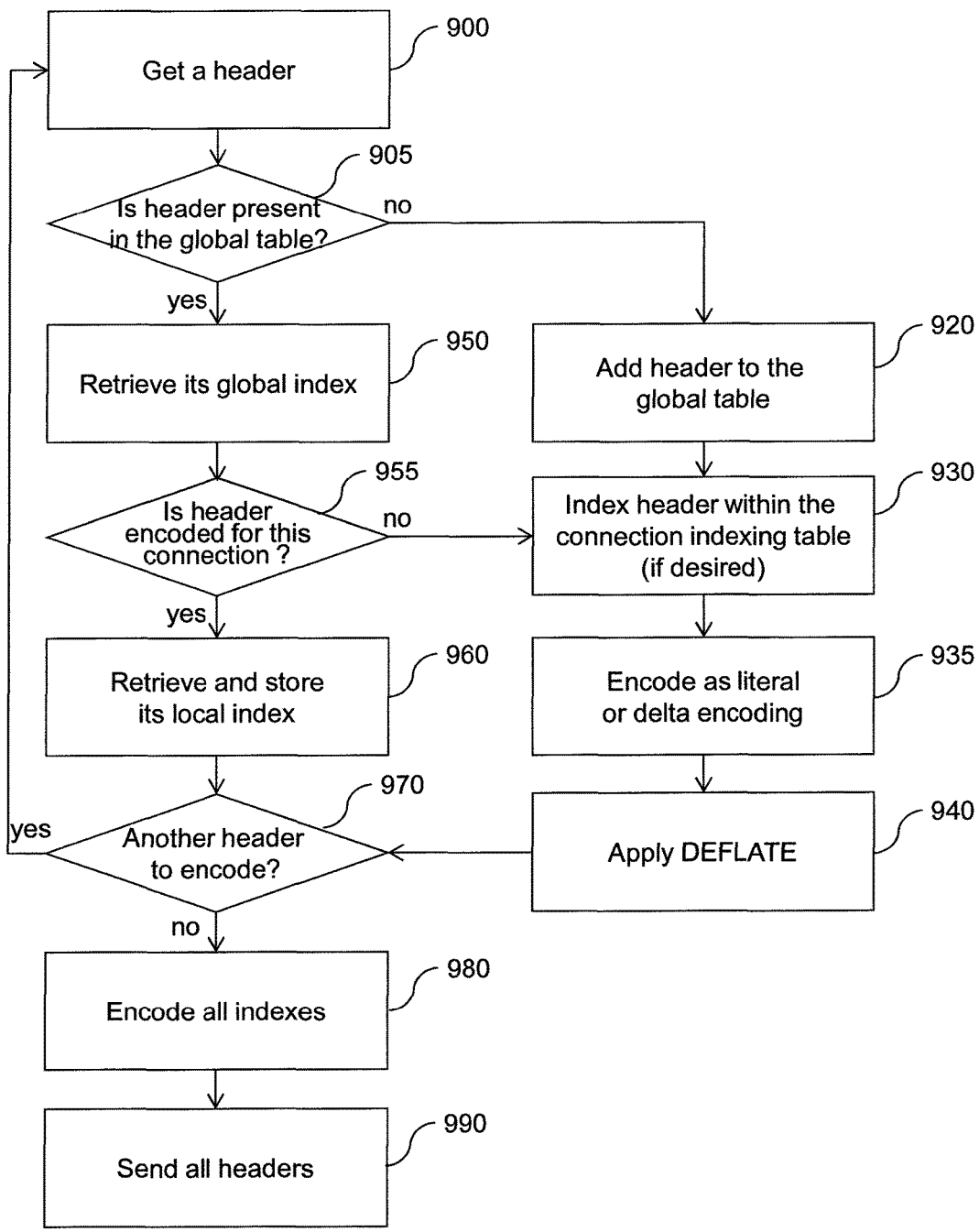
FIG. 9 is a flowchart illustrating general steps of an HTTP header encoding process based on a shared global table according to a second embodiment of the invention.

An encoding process based on the shared global table is now described with reference to FIG. 9.

Contrary to the use of a shared global table, it is difficult to share the Deflate buffer between several connections since the Deflate buffers are continuously updated.

In this context, using the shared global table to share memory costs makes it possible to reduce the Deflate window size, thus achieving gains in speed and memory savings while maintaining very good compression ratio through the indexing tables.

Compared to FIG. 7, a different approach is taken at the header indexing step 740 and at the header index retrieving steps if any (steps 710 and 720).

In detail, the encoding process starts by retrieving a header to encode (step 900).

The header is then searched for in the shared global table (step 905). Conventional search mechanisms with high search speed may be used.

If it is not found, it is encoded as a literal header or using delta encoding (steps 920 to 940): the header is added to the shared global table if indexing is decided (step 920) and a reference to the header representation stored in that shared global table is added to the local indexing table specific to the connection considered (the connection to which the message including the header being processed here belongs—step 930). The header is then encoded (literally or delta using a reference header) and Deflate compressed in the second list of literally and delta-encoded headers (steps 935 and 940).

If the header is found in the shared global table, the associated header reference (i.e. global index in the shared global table) is retrieved in step 950. This reference allows fast checking of whether the header has already been encoded for the connection considered, by checking the presence of that reference within the connection-specific local indexing table (step 955).

If the header has not already been encoded for the connection, it is indexed in the connection-specific local indexing table if indexing is decided (step 930) and literally or delta encoded as appropriate, and compressed in the second list of literally and delta-encoded headers (steps 935 to 940).

If the header has already been encoded for the connection, the header index is retrieved from the connection-specific local indexing table and stored in the first list of indexes (step 960).

Once all headers have been processed, the indexes of the first list are encoded into a serialized binary encoded representation and the concatenated first and second lists (namely their serialized binary representation) are sent (steps 980 and 990) in a similar manner to steps 770 and 780. In particular, the Deflate compression of step 940 may optionally be performed only once on the serialized binary representation of all the literally and delta-encoded headers (the second list), after step 970.

In a variant of this Figure, the search made at step 905 can be performed within the connection-specific local indexing table itself. In that case, the header index is directly retrieved from the connection-specific local indexing table. For example when the local indexing table contains only references to the headers which are actually stored in the shared global table using pointers to that global table, this may be done by searching, within the local indexing table, for a pointer to the searched header. In case no pointer is found, it is necessary to determine whether or not the searched header is already existing in the shared global table, so that it is inserted in that global table or not when inserted to the local indexing table. As a consequence, this variant of step 905 requires an additional search in the shared global table whenever a header is inserted in the local indexing table.

This alternative has impact on the shared global table management, in particular when there is a need to reduce the size of that global table. In that case, entries may not be easily removed from the global table. One possibility is to switch from one global table to another and remove the old global table at some point as explained below with reference to the global table migration of FIG. 11 or to keep the shared global table and the local indexing tables tightly synchronized as explained below with reference to the global table optimization of FIG. 12.

In another variant, the shared global table may be managed so that only shareable headers are actually stored in the global table. This is because memory savings are obtained only if the headers in the global table are reused over several connections.

In particular, only frequent shareable headers can be actually stored in that global table. The shareable header may for example be predetermined and known by both the decoder and the encoder based on the HTTP standard. They may also be headers other than the below defined private headers. This makes it possible to optimize memory use with the headers that are worthy to be stored in a shareable manner.

Various level of management may be applied for the other headers (i.e. not determined as being shared).

For example, private headers (such as cookies or sensitive data, connection-specific data such as "Host" or "Referer", etc.) may be literally-encoded and then Deflate compressed.

In another example, a two-level indexing mechanism is used, whereby frequent and shared headers are stored in the shared global table while frequent but not shared (i.e. private) headers are stored in the connection-specific local indexing table. The other headers are not indexed. In that case, the local indexing table comprises headers indexed by reference to the global table and headers indexed within the local indexing table alone. Furthermore, deciding to index a header in the local indexing table alone or by reference to the global table depends on a determined frequency of that header in this embodiment.

The private, shareable and/or frequent headers may be defined as such in predefined lists provided to the encoder (and if needed to the decoder).

Figure 10:
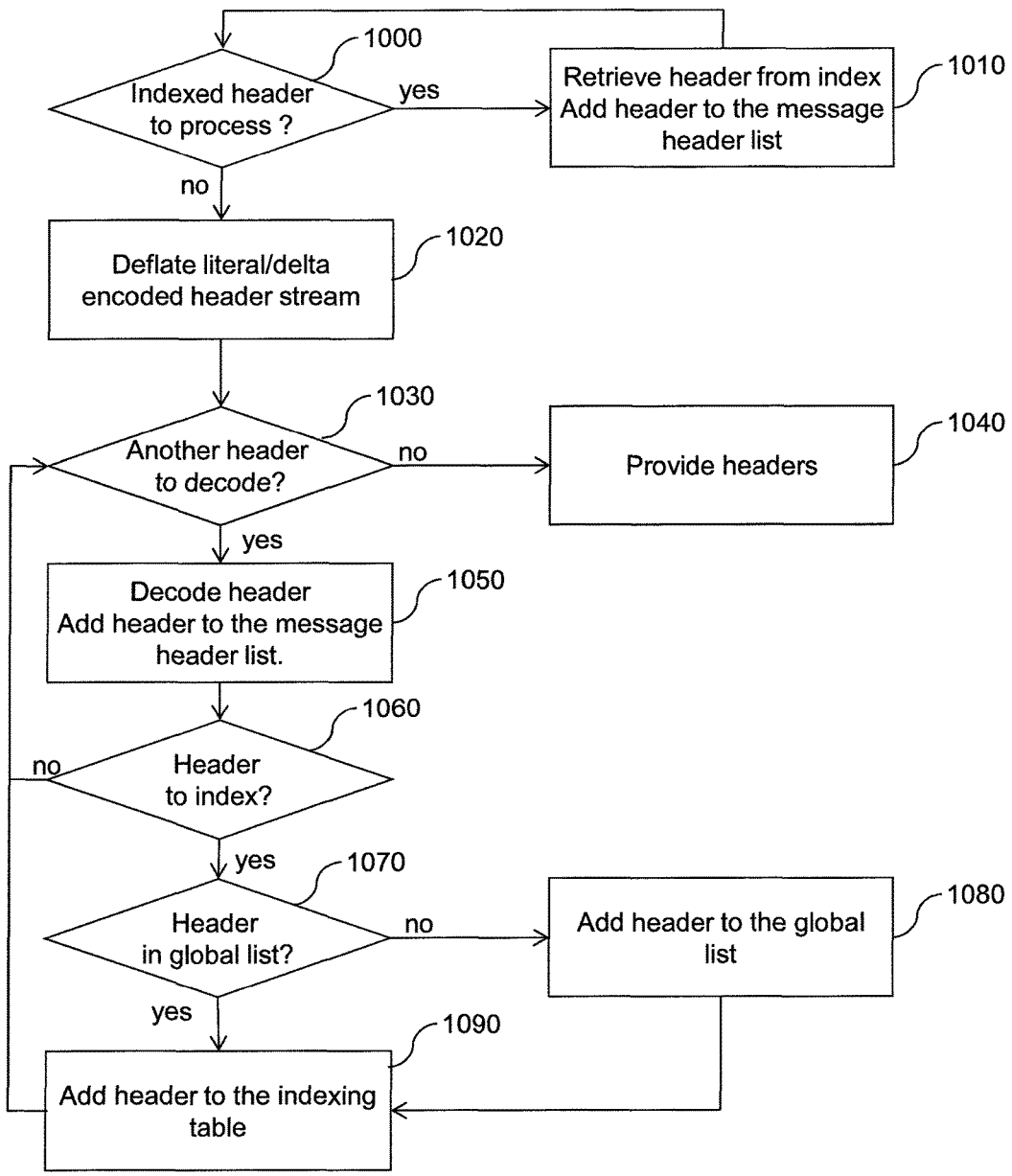
FIG. 10 is a flowchart illustrating general steps of an HTTP header decoding process based on a shared global table according to a second embodiment of the invention.

FIG. 10 is a flowchart illustrating the corresponding decoding based on the shared global table. As for FIG. 9 which is an adaptation of FIG. 7, the process of FIG. 10 is also an adaptation of FIG. 8.

However the process of FIG. 10 requires more processing than the one of FIG. 8 since for every newly indexed header, an additional search is performed in the global table, which can be expensive at the decoder. This is in contrast to the processing at the encoder where only one header search is required with or without the use of the shared global table. This allows memory saving at the expense of processing speed. To mitigate these drawbacks, the indexing criteria may be limited to only index some headers, for example the shareable headers and/or those that are the most frequent in several connections as provided above.

The indexed headers are first decoded since they are generally put first in the bitstream (steps 1000 and 1010, regardless any preliminary step for obtaining the headers that have been serialized only, i.e. not encoded nor binary compressed). The decoder decodes the header index from the bitstream. The header index may be read from the binary representation as shown in FIG. 14. It then either finds the header directly in the connection-specific local indexing table thanks to the decoded header index, or finds the header using the global table and the reference associated with the decoded header index in the connection-specific local indexing table. The decoded header is then stored in the message header list.

This is because the connection-specific local indexing table can either store the header representation or a reference to its representation that is stored in the global table. The global table may directly store headers as strings or in parsed representations.

Literally/delta-encoded headers are then decoded through steps 1020 to 1090.

The bitstream is first decompressed using Deflate (step 1020) to obtain a binary stream.

The decompressed binary stream is then processed to parse it according to the binary representations shown in FIGS. 15 to 18 until no more data is available (test 1030). As long as binary data is available, a header is first parsed. Flags are read to determine whether the encoded header has to be delta decoded or to be literally decoded/The header name and header value are obtained using a reference header if any (in case of delta encoding) and the resulting decoded header is added to the message header list (step 1050).

Similarly to step 850, the strategy for indexing the header is determined at step 1060, for example by reading corresponding flags in the binary representation.

If the header has not to be indexed, the decoding process continues with another header (loop back to step 1030).

Otherwise, it is tested whether the header is already in the global table at step 1070.

In the negative, the header is added to the global table as a new entry or in replacement of the reference header used, at step 1080, meaning that a reference associated with that new header is created. Practically, in most cases, the header will be added as a new entry.

In the affirmative or after step 1080, the header is added to the connection-specific local indexing table at step 1090, by association of a corresponding index with the reference to the global table header entry.

When all the binary data have been processed, the decoded headers (i.e. the whole message header list, possibly reordered according to an order specified in the bitstream by the encoder) are provided as an output to, for instance, an application (step 1040).

In particular embodiments of the invention, described below with reference to FIGS. 11 and 12, optimizations of the shared global table use are provided with a goal of reducing memory consumption.

Since the shared global table will span the lifetime of several connections, some headers therein may become irrelevant when a given connection is closed.

The shared global table will continuously grow while the number of headers used may not actually grow. There is therefore a need to ensure that headers in the shared global table remain relevant to existing connections and to remove from the global table headers that are no longer relevant to current connections. The optimizations of FIGS. 11 and 12 address this issue at the encoder. Of course, similar optimization should be provided at the corresponding decoder.

Figure 11:
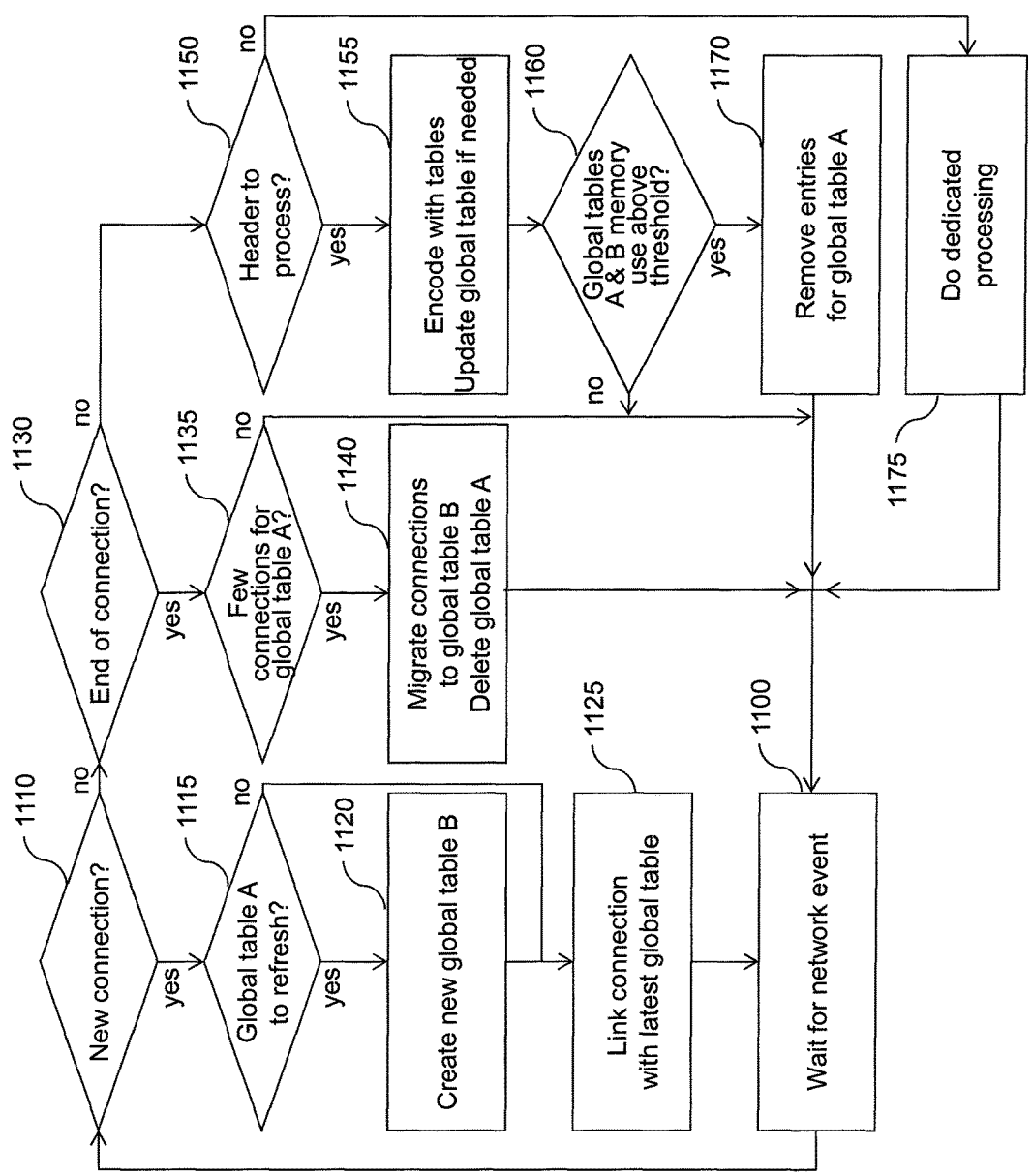
FIG. 11 is a flowchart illustrating steps of migrating current connections from a current shared global table to a new shared global table.

FIG. 11 is a flowchart illustrating steps of migrating current connections from a current global table to a new global table. The new global table will be devoid of non-used headers unlike the current global table.

This process is based on switching from one shared global table to another at a given time: at some point a shared global table is created and all new connections will use the new shared global table while the old connections will remain with the initial shared global table. The old shared global table will have the number of its connections decreasing to a small number, at which time the remaining connections will be migrated to the new shared global table. The old shared global table will be deleted to free memory space.

This approach ensures that the overall memory used by the global table does not continuously grow over time.

The process of FIG. 11 starts at step 1100 by waiting for a network event received by the network node encoding messages based on local indexing tables and a current shared global table. It is assumed that all the current connections are linked to the same current shared global table A, meaning that their connection-specific local indexing tables all refer to that global table A.

If the incoming network event is a new connection (test at step 1110), whether the current shared global table needs to be refreshed or not is first checked (step 1115). Refresh criteria may be based on different information: current global table age, and/or number of connections closed since the global table has been created, etc. Furthermore, if the current global table is already in a migration phase (meaning that a new global table has already been created, as explained below), there is no need to refresh it.

If the global table needs to be refreshed, a new global table B is created at step 1120. That means that the new global table is created upon receiving a request for a new connection, depending on at least one criterion relating to the currently shared global table. This global table B can be initialized as an empty table or can be prefilled with commonly used headers. The new connection (corresponding to the event received) is then linked to that new global table at step 1125, meaning that the corresponding connection-specific local indexing table will associate indexes with references to that new global table B (and not to the current global table A).

When the received network event is either a new connection while a migration is in course (test at step 1110) or an end of connection (test at step 1130), whether a header needs to be processed or not is checked at step 1150. A migration is in course when two global tables A and B exist at the same time.

If no header needs to be processed (output "no" at step 1150), a processing dedicated to the received network event is performed at step 1175 before waiting for a new network event by looping back to step 1100.

If a header has to be processed, that header is encoded based on the connection-specific local indexing table (an index is retrieved if it already exists, using the global table to which the connection is linked) and the linked global table and connection-specific local indexing table are updated if the processed header needs to be inserted (step 1155).

An optional step (step 1160) may be carried out to cap the total memory used by the global tables A and B: if the total memory is above a given threshold once the processed header has been indexed and added to the tables (test 1160), some entries may be removed from the global table A (step 1170) to decrease memory consumption. Examples of entries that can be removed are the oldest entries, the least frequently used entries, etc. Of course, when an entry is removed from the global table, the corresponding entry in the local indexing tables also has to be removed since the reference to the global table no longer exists.

The process then loops back to step 1100 of waiting for a next network event.

When the received network event is an end of connection event and the migration is in course (detected at step 1130), whether only a few connections are linked to the current global table A or not is checked at step 1135. Few may advantageously mean a predetermined number of connections, for example less than 5% of on-going connections.

If this is the case, all those connections (linked to global table A) are migrated to the new global table B (step 1140): this comprises removing entries used by the current connections from the current global table A; adding those removed entries into the new global table B; and then deleting said currently shared global table from memory. Of course the local indexing tables of those migrated connections also have to be updated so that they now refer to the migrated entries in the new global table B, instead of the deleted entries of the deleted global table A. Adding the removed entries to B may be performed while avoiding duplication of those entries. That is, if a removed entry already exists in B, it is not added thereto but the local indexing tables of the migrated connections are updated so that they now refer to this already existing entry.

In this part of the process, migrating current connections is thus triggered upon receiving a request to end a current connection.

The advantage of this process is that the migration phase processing is limited in time and may be carried out when the network node has processing capacities available. In particular, step 1140 may be carried out asynchronously.

A different approach is now described with reference to FIG. 12, where instead of creating and deleting global tables, the current global table is kept synchronized with the current connections: all the headers in the global table are used by the current connections (i.e. referenced by the local indexing tables). Such an approach is preferable to the approach of FIG. 11, when there is a risk of the current global table not remaining naturally synchronized with the connections over a long period of time.

Figure 12:
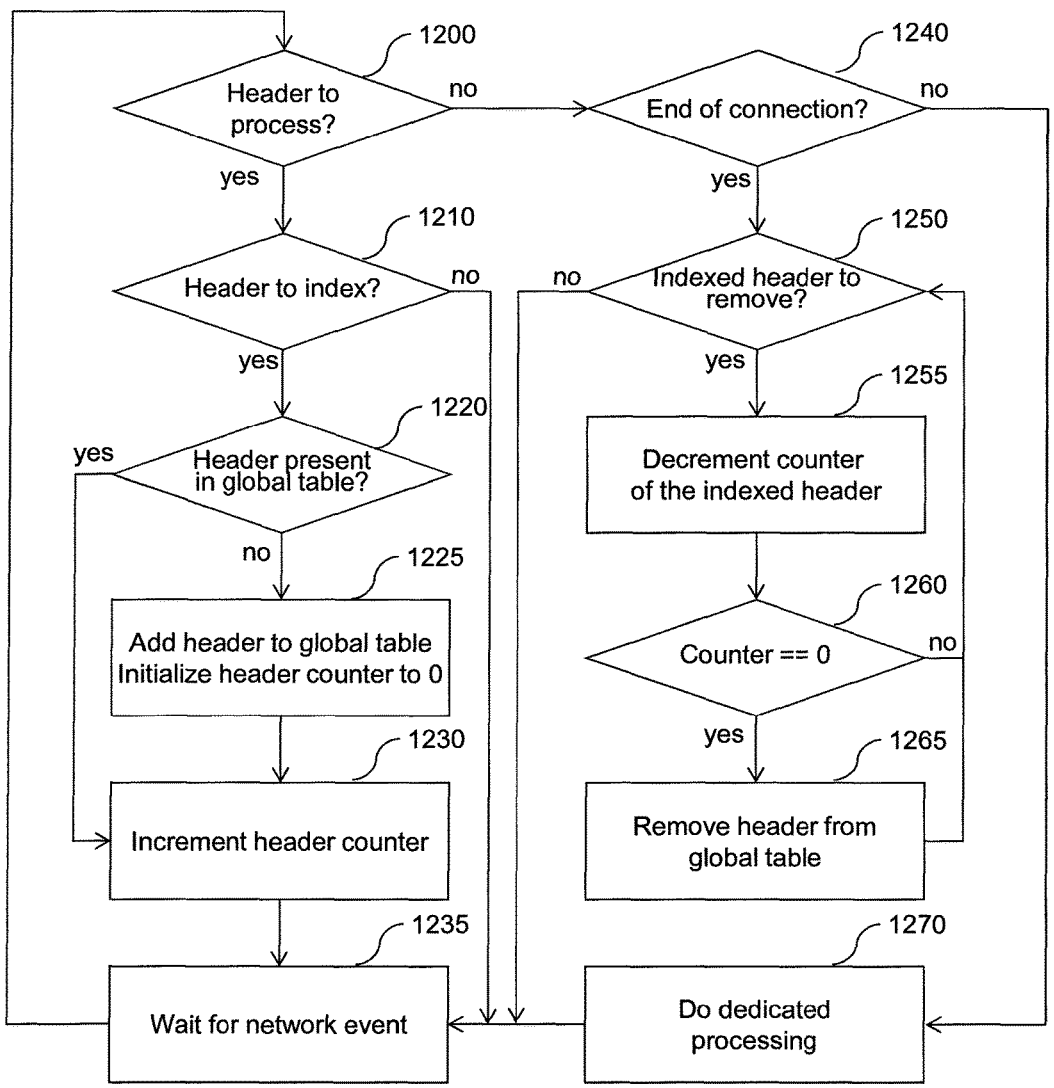
FIG. 12 is a flowchart illustrating steps of optimizing a shared global table according to the age of connections.

In the approach of FIG. 12, each indexed header in the global table is associated with a connection counter that counts the number of connections using that indexed header, and a memory saving operation is carried out based on connection counters of the indexed headers. In particular, the memory saving operation comprises removing any indexed header from the global table whose corresponding connection counter is zero. This ensures the global table only stores headers that are used by the current connections. The global table is thus synchronized with the current connections' state.

The process may start at step 1235 by waiting for a network event received by the network node.

Based on the received event, whether a new header has to be processed or not is first checked at step 1200.

In the affirmative, whether the new header should be indexed or not is checked at step 1210.

If so, whether its representation is already in the global table or not is checked at step 1220.

If it is already present, a counter associated with the entry of that header in the global table is incremented at step 1230. The counter is used to reflect the number of connections that use the corresponding header. In this context, it is named "connection counter".

If it is not present, the header is added to the global table and its connection counter is initialized to 0 (step 1225) before being incremented by one (step 1230).

After step 1230, the process loops back to step 1235 of waiting a next network event.

If the received event is not a new header to process, it is checked whether or not it is an end-of-connection event (test at step 1240).

If it is, a connection has thus stopped (meaning that the corresponding local indexing table will be deleted in the near future). All the headers indexed in the local indexing table specific to the stopped connection are processed before deletion.

For each entry in that local indexing table (test 1250), the corresponding connection counter in the global table is decremented by one at step 1255. The "corresponding connection counter" is the counter associated, in the global table, with the entry having the reference indicated in the entry considered of the local indexing table.

If the connection counter reaches 0 (test 1260), the header representation is removed from the global table at step 1265 to free memory space.

Once all the entries of the local indexing table have been processed, the process loops back to step 1235.

If the received network event is neither a header to process nor an end-of-connection event, it is conventionally processed by dedicated processing at step 1270 before looping back to step 1235.

The process of FIG. 12 allows tight synchronization between the global table and the local indexing tables (i.e. the current connections). This comes at the expense of the processing that must take place synchronously during the network communications and some additional memory consumption, since a connection counter is kept up to date for each header of the global table.

In addition to these processes of optimizing the global table use, there may be additional optimization processes.

For example, it may be necessary for the network node to free memory space. In that case, the global table may be scanned to find appropriate entries to delete and thus to reduce the global table size. One approach comprises resetting the current connections that use indexed headers associated with connection counters of values lower than a threshold value. The same connection counters as defined above are used. Upon determining all the headers for which the connection counters have a low value, the corresponding connections (those using the determined headers) are reset. This allows removal of all the low-counter headers from the global table at the expense of forcing the client to open a new fresh connection that has no indexed headers.

Of course criteria other than the connection counter alone may be used to forcefully remove headers from the global table. For example, a criterion may be based on a creation date or a last usage date (the date doesn't need to be a full date, but can be a short integer increased regularly, as for example a 4-bit integer corresponding to 1 minute spans, enabling times from 0 to 15 minutes to be measured) defined for each entry in the global table. Thus, only the oldest headers are removed.

Another additional optimization process may comprise, upon receiving a request to free memory, saving, in memory, the number of headers indexed in the local indexing table (i.e. generally the maximum number of indexes already used); deleting the global table; and indexing new headers in the local indexing table using indexes starting from the saved number. This may be of course carried for all the local indexing tables corresponding to connections linked to the deleted global table.

Thus each local indexing table keeps the number of past entries and will index new entries (i.e. headers) using that number as the first index. This allows new header indexes to remain compatible with the coder indexing tables.

In particular, the decoder is not forced to perform the same deletion of global table since it can detect new indexing starting from the number of past entries. However, the decoder can implement the same deletion strategy as the coder, meaning that they both receive the request to free memory at the same time and perform the same deletion.

In a variant, the decoder may add a flag to the bitstream to indicate to the decoder when it has performed memory freeing. This enables the decoder to also flush its memory (global table) at the same point in the decoding process.

The above processes are based on indexing information items (HTTP headers in the case of SPDY).

A processor may however decide to enable or disable this header indexing for any or all network connections. Criteria on which to base this decision may relate to speed or compression improvements.

As regards compression improvements, the header indexing approach (i.e. use of indexes) may be enabled based on the computation of Deflate compression ratios.

For example, the compression ratio achieved for the headers of the first and second requests of a current connection may be computed. Next, if the compression ratio for the second request (ratio H2) is not much higher than the compression ratio of the first request (ratio H1), the header indexing provides substantial compression improvements. It has been observed that 80% is a good threshold for the ratio H2/H1 to trigger header indexing (if H2/H1≥80%).

This is may be because the Deflate compression context built from the first request appears not to be efficiently used for the second request, probably because the context (sliding window) is too small.

As regards speed improvements, the number of messages exchanged in a connection appears to be closely related to speed performance.

To illustrate this, when a single message is exchanged in a connection, the cost of building a local indexing table, even if small, is not compensated by the use of that indexing table.

As soon as an increasing number of messages is exchanged, the indexing table is increasingly used, leading to speed gains. Typically, header indexing provides substantial speed improvements for exchanges with more than five messages and 2× speed improvements for exchanges with more than ten messages.

A network node may then decide to compute statistics on the number of messages per connection, and based on an average number for all networked nodes or an average number per network node, it may be decided to use the header indexing or not.

Examples of binary representations for the headers depending on how they are encoded (literally, delta encoding, indexing) are now described with reference to FIGS. 14 to 18.

FIG. 14 shows a binary representation for a header of the first list that is encoded using an index from the local indexing table.

A first byte comprises a first bit set to "1" to specify that the header is fully encoded using an index. The remaining seven bits of the byte are used to specify the index value if comprises between 0 and 126 (bit values from "000 0000" to "111 1110").

In case the index value is greater than 126, the seven bits are set to 127, i.e. "111 1111". And a following byte is used to specify the index value minus 127 (bit values from "0000 0000" to "1111 1111" to encode index from 127 to 382).

In this embodiment, index value cannot be greater than 382. Of course other implementations may allow index values greater than 382, for example by using one specific value for the additional byte to specify than another additional byte is used.

FIG. 15 shows a binary representation for a header of the second list that is literally encoded. The shown byte is used to specify that such literal encoding is used and to encode the header name. The byte (sometimes several bytes) is followed by one or more bytes to literally encode the header value as shown below in FIG. 18.

The first bit of the shown byte is set to "0" to specify that the header is not encoded using an index as in FIG. 14.

The second bit is used to specify whether or not delta encoding is used (see below delta encoding with reference to FIGS. 16 and 17). As FIG. 15 corresponds to a literal encoding, this second bit is set to "0".

The third bit is used to define whether or not the header being encoded has to be indexed in the local indexing table for further indexing. The same bit is used for the same function in the case of delta encoding of FIGS. 16 and 17).

This third bit is set to "0" if the encoder decides not to index the header (see step 740). Otherwise it is set to "1" indicating to the decoder that the header has to be added to the local indexing table.

The remaining five bits (bits 3 to 7) are used to encode the header name.

In one embodiment, in order to encode header names, a list of HTTP header names, comprising well-known HTTP header names, is used. Most frequent headers are assigned lowest indexed so that they can be encoded more efficiently. This list is static and is shared between the encoder and the decoder: no new header name can be added to it. It may be downloaded from a server.

In one embodiment, since extra header names may be used in addition to well-known ones, another list (namely extra header name list) comprising extra header names is also defined. This list is initially empty, but the encoder is free to add header names to it. As a consequence, if an extra HTTP header name occurs more than once on a given connection, it should be encoded literally only once, and then be encoded as a reference to an entry of the extra header name list.

Indexing rules for the header name are known from both the encoder and the decoder to ensure synchronization.

The remaining five bits may take several values:

a range of values, "0 0000" to "1 1100" in the example, is used to encode the index of a well-known header name if the index is comprised between 0 and 28;

a value, "1 1101" in the example, is used to indicate that the index of a well-known header name if greater than 28. In that case, one or several additional bytes (not shown) that follow the current byte are added to encode the index minus 29;

a value, "1 1110" in the example, is used to indicate that a new extra header name is literally encoded. In that case, one or several additional bytes (not shown) that follow the current byte are added to literally encode the new extra header name: its length is first encoded and then its value. Detecting such value the decoder will know that the new extra header name has to be added to the extra header name list;

a value, "1 1111" in the example, is used to indicate that the header name is encoded using an index of an extra header name already indexed in the extra header name list. In that case, one or several additional bytes (not shown) that follow the current byte include the index of such extra header name in the extra header name list.

FIGS. 16 and 17 show binary representations for headers of the second list that are delta encoded. FIG. 16 corresponds to the case where it is decided not to index the delta-encoded header for further indexing. FIG. 17 corresponds to the case where it is decided to index the delta-encoded header for further indexing.

The shown byte is used to specify that such delta-encoding is used and to encode the index of the header already indexed that is used as reference for delta encoding. The byte (sometimes several bytes) is followed by one or more bytes to encode the header value, in particular to define a common part between the header value and the value taken by the reference header and to literally encode the difference between values using the header value frame as shown below in FIG. 18.

As introduced above with reference to FIG. 15, the first bit of the byte is set to "0" to specify that the header is not encoded using an index as in FIG. 14, and the second bit is set to "1" to specify that delta encoding is used.

In FIG. 16, the third bit is set to "0" since no indexing is requested for the header being encoded.

In that case, the remaining five bits (bits 3 to 7) are used to encode the index of the reference header used as a reference for delta encoding. They may take several values:

a range of values, "0 0000" to "1 1110" in the example, is used to encode the index of the reference header if the index is comprised between 0 and 30;

a value, "1 1111" in the example, is used to indicate that the index of the reference header is greater than 30. In that case, one or several additional bytes (not shown) that follow the current byte include the index of the reference header minus 31.

This or these bytes are followed by one or more bytes to encode the header value.

In one embodiment, a first byte (or more if needed) includes the length of the common prefix shared by header value being encoded and the header value taken by the reference header. A common prefix may be the number of similar starting characters between the two values. Length between 0 and 127 is encoded onto one byte, whereas length between 128 and 32896 is encoded onto two bytes.

The bytes for specifying the length of the common prefix are followed by the one or more bytes to literally encode difference between the two values (i.e. the remaining data while the common prefix is discarded from the header value being encoded) as shown below in FIG. 18.

In another embodiment where the two values (header value being encoded and the header value taken by the reference header) are number, only the numeral difference between the two values can be literally encoded using only the header value frame of FIG. 18 (no byte for specifying the length of the common prefix being used).

Contrary to FIG. 16, in FIG. 17, the third bit is set to "1" since indexing is requested for the header being encoded.

In that case, the fourth bit is used to define the indexing mode as decided by the encoder, i.e. between incremental indexing and substitution indexing. For example, the fourth bit is set to "0" if incremental indexing has been decided, and is set to "1" if substitution indexing has been decided.

In this embodiment, the combination of the third and fourth bits offers a binary flag to define the indexing of the header being encoded.

The remaining four bits (bits 4 to 7) are used to encode the index of the reference header used as a reference for delta encoding. They may take several values:

a range of values, "0000" to "1110" in the example, is used to encode the index of the reference header if the index is comprised between 0 and 14;

a value, "1111" in the example, is used to indicate that the index of the reference header is greater than 14. In that case, one or several additional bytes (not shown) that follow the current byte include the index of the reference header minus 15.

As for the case of FIG. 16, this or these bytes are followed by one or more bytes to encode the header value.

In one embodiment, a first byte (or more if needed) includes the length of the common prefix shared by header value being encoded and the header value taken by the reference header. A common prefix may be the number of similar starting characters between the two values. Length between 0 and 127 is encoded onto one byte, whereas length between 128 and 32896 is encoded onto two bytes.

The bytes for specifying the length of the common prefix are followed by the one or more bytes to literally encode difference between the two values (i.e. the remaining data while the common prefix is discarded from the header value being encoded) as shown below in FIG. 18.

In another embodiment where the two values (header value being encoded and the header value taken by the reference header) are number, only the numeral difference between the two values can be literally encoded using only the header value frame of FIG. 18 (no byte for specifying the length of the common prefix being used).

FIG. 18 partially shows a binary representation for a header value (including difference value as defined above) of the second list that is literally encoded.

Header values are encoded literally by first indicating their length and then their value. In the case of delta indexing, the delta value is encoded similarly to a header value. However, complementary data describe how the whole header value can be obtained from this delta value (for example using the common part definition bytes).

The length of the value to encode is specified onto one or two bytes.

The first bit of a first byte as shown in FIG. 18 indicates whether the length is encoded onto one byte (first bit set to "0") or two bytes (first bit set to "1").

If the first bit is "0", the header value length is encoded on the remaining seven bits of the byte (length from 0 to 127). If the first bit is "1", the header value length minus 128 is encoded on the next fifteen bits (length from 128 to 32,896).

Then the value is encoded on following bytes (not shown—the number of which depends on the header value length).

Although the present invention has been described hereinabove with reference to specific embodiments, the present invention is not limited to the specific embodiments, and modifications which lie within the scope of the present invention will be apparent to a person skilled in the art. Many further modifications and variations will suggest themselves to those versed in the art upon making reference to the foregoing illustrative embodiments, which are given by way of example only and which are not intended to limit the scope of the invention as determined by the appended claims. In particular different features from different embodiments may be interchanged, where appropriate.

The invention claimed is:

1. A method of encoding HTTP messages into a bitstream, an HTTP message including an initial list of HTTP headers, the method comprising:
receiving a plurality of HTTP messages in serial;
comparing a subsequent HTTP message to a local indexing table generated from a prior HTTP message to determine a first group of indexes representing HTTP headers of the initial list of the HTTP message that are already indexed in the local indexing table and a second group of literal values forming other HTTP headers of the initial list of the HTTP message not yet indexed in said local indexing table, wherein the first group of indexes represents HTTP headers of the subsequent HTTP message that are similar to HTTP headers of the prior HTTP message and the second group of literal values represents HTTP headers of the subsequent HTTP message that are different than the HTTP headers of the prior HTTP message;
encoding the indexes of the first group to obtain a binary representation of the indexes representing the HTTP headers already indexed;
binary compressing at least a serialized binary representation of the literal values of the second group;
updating the local indexing table by adding indexes corresponding to the second group in parallel to the binary compressing of the serialized binary representation of the literal values of the second group; and
concatenating the binary representation of the indexed of the first group with the compressed binary representation of the second group to obtain a binary representation of the initial list of the HTTP message as an encoded bitstream of the HTTP headers.

2. The encoding method of claim 1, wherein at least one of the other HTTP headers is encoded by reference to an HTTP header already indexed in the local indexing table, and the literal value of the other HTTP header is representative of a difference between a value taken by the other HTTP header and a value taken by the HTTP header already indexed and used as a reference.

3. The encoding method of claim 2, wherein a binary sub-part of the serialized binary representation corresponding to the other HTTP header includes, in addition to the literal value of the other HTTP header, an index of the HTTP header already indexed and used as a reference.

4. The encoding method of claim 3, wherein the binary sub-part includes a binary field to define a length of a common part between a value taken by the other HTTP header and a value taken by the HTTP header already indexed and used as a reference.

5. The encoding method of claim 2, comprising substituting the HTTP header already indexed in the local indexing table with the other HTTP header encoded by reference to the HTTP header already indexed.

6. The encoding method of claim 1, wherein a binary sub-part of the serialized binary representation corresponding to one of the other HTTP headers includes, in addition to the literal value of the other HTTP header, a first one-bit flag defining whether the other HTTP header is encoded by reference to an HTTP header already indexed in the local indexing table or not; and a second binary indexing flag defining whether the other HTTP header has to be added to the local indexing table for further indexing or not.

7. The encoding method of claim 6, wherein the second binary flag includes a bit to define whether the other HTTP header has to be added to the local indexing table as a new entry or by substitution of the HTTP header already indexed and used as a reference.

8. The encoding method of claim 6, wherein the binary sub-part includes a binary field to define an index corresponding to a name of the other HTTP header in an item name table.

9. The encoding method of claim 1, wherein the first group of indexes is prior to the second group of literal values in the encoded bitstream.

10. The encoding method of claim 1, wherein the step of concatenating generates a serialized binary representation of the concatenated first and second groups, and the step of binary compressing compresses the whole serialized binary representation.

11. The encoding method of the claim 1, wherein an HTTP header is made of at least an HTTP name and an HTTP value, and an indexed HTTP header of the first group comprises an index indexing the HTTP name and comprises the literal HTTP value.

12. The encoding method of claim 1, wherein an HTTP header is made of at least an HTTP name and an HTTP value, and the method further comprises associating an indexing level flag with an HTTP header, said indexing level flag taking, depending on the HTTP header, either a first full indexing state indicating that the HTTP header has the same HTTP name and HTTP value as the corresponding HTTP header in the local indexing table, or a second partial indexing state indicating that the HTTP header has the same HTTP name as the corresponding HTTP header in the local indexing table but a different HTTP value.

13. The encoding method of claim 12, wherein the HTTP header is an indexed HTTP header of the first group.

14. The encoding method of claim 12, wherein in case the indexing level flag for an indexed HTTP header is in the second partial indexing state, the different HTTP value of the indexed HTTP header is encoded using a difference between the different HTTP value and the HTTP value of the corresponding HTTP header in the local indexing table.

15. The encoding method of claim 1, further comprising updating the local indexing table by associating, within that local indexing table, at least one HTTP header of the second group with a new index.

16. The encoding method of claim 15, further comprising associating, in the encoded stream, an indexing flag with each binary-compressed HTTP header of the second group that is associated with a new index during said updating.

17. The encoding method of claim 15, further comprising determining a frequency of occurrence of an HTTP header of the second group, and deciding to index said HTTP header in the local indexing table depending on the determined frequency.

18. The encoding method of claim 1, wherein the local indexing table associates each index with a reference to an entry of a global table, said entry of the global table comprising the HTTP header associated with said index.

19. The encoding method of claim 18, wherein the local indexing table comprises at least one HTTP header indexed by reference to the global table and at least one HTTP header indexed within the local indexing table alone.

20. The encoding method of claim 19, further comprising determining a frequency of occurrence of an HTTP header, and deciding to index said HTTP header in the local indexing table alone or by reference to the global table depending on the determined frequency.

21. The encoding method of claim 18, wherein the global table is shared between a plurality of compressors and comprises HTTP headers from HTTP messages processed by said plurality of compressors, each compressor having its local indexing table to index, by reference to the shared global table, HTTP headers from HTTP messages that it processes.

22. The encoding method of claim 18, wherein determining the first and second groups comprises searching for entries in the global table that correspond to the HTTP headers of the initial list and searching, in the local indexing table, for references to the entries found.

23. The encoding method of claim 18, wherein the global table is shared between a plurality of network connections and referred to by a corresponding plurality of respective local indexing tables, and the method further comprising, at some point during the encoding, migrating current connections from said shared global table to a new global table.

24. The encoding method of claim 23, wherein the new global table is created upon receiving a request for a new connection, depending on at least one criterion relating to the currently shared global table.

25. The encoding method of claim 23, further comprising removing entries from the currently shared global table based on the amount of memory used to store both currently shared and new global tables.

26. The encoding method of claim 23, wherein migrating current connections is triggered upon receiving a request to end a current connection.

27. The encoding method of claim 23, wherein migrating current connections comprises removing entries used by the current connections from the currently shared global table; adding those removed entries to the new global table; and then deleting said currently shared global table from memory.

28. The encoding method of claim 18, wherein the global table is shared between a plurality of network connections and referred to by a corresponding plurality of respective local indexing tables, each indexed HTTP header in the shared global table being associated with a connection counter that counts the number of connections using that indexed HTTP header, and the encoding method further comprising performing a memory saving operation based on connection counters of the indexed HTTP headers.

29. The encoding method of claim 28, wherein the memory saving operation comprises removing the indexed HTTP header from the shared global table when the corresponding connection counter is zero.

30. The encoding method of claim 28, wherein the memory saving operation comprises resetting the current connections that use indexed HTTP headers associated with connection counters of values lower than a threshold value.

31. The encoding method of claim 18, further comprising upon receiving a request to free memory, saving the number of HTTP headers indexed in the local indexing table; flushing the global table; and indexing new HTTP headers in the local indexing table using indexes starting from the saved number.

32. The encoding method of claim 1, further comprising choosing between a first encoding of the initial list of HTTP headers using said steps of determining, concatenating and binary compressing, and a second encoding of the initial list of HTTP headers using only binary compression of a serialized binary representation of the item literal values;
 a sliding binary window used for the binary compression of the first encoding being of lower size than a sliding binary window used for the binary compression of the second encoding.

33. The encoding method of claim 1, wherein the serialized binary representation of the literal values keeps said values according to their relative order in the initial list.

34. The encoding method of claim 1, wherein the bitstream comprises additional information storing the order of the HTTP headers within the initial list.

35. The encoding method of claim 1, wherein the HTTP message includes a second initial list of HTTP headers, and the encoding method comprises providing a serialized binary representation of literal values of the HTTP headers of the second initial list and concatenating it with the encoded bitstream of the HTTP headers resulting from the first and second groups.

36. The encoding method of claim 35, wherein the serialized binary representation for the second initial list is prior to the encoded bitstream in the resulting bitstream.

37. A non-transitory computer-readable medium storing a program which, when executed by a microprocessor or computer system in an apparatus, causes the apparatus to perform the steps of claim 1.

38. A method of encoding HTTP messages to send over a plurality of network connections established with a plurality of respective addressee entities, each HTTP message including a list of alphanumerical HTTP headers, the method comprising, for each HTTP message of a plurality of HTTP messages:
 determining, from the plurality of network connections, a connection established with one of the addressee entities on which the HTTP message has to be sent;
 determining a local indexing table specific to the determined connection established with the addressee entity, the local indexing table associating, in local entries, alphanumerical HTTP headers with respective indexes to be used to encode the alphanumerical HTTP headers;
 encoding the list of alphanumerical HTTP headers of the HTTP message to be sent, using alphanumerical HTTP header indexing based on the determined local indexing table specific to the determined connection established with the addressee entity;

wherein a global table is shared between the network connections established with the plurality of addressee entities and associates, in global entries, alphanumerical HTTP headers with global indexes; and the local indexing table of each connection established with one of the addressee entities, including the determined connections, associates at least one alphanumerical HTTP header with a respective index by providing, the corresponding local entry, a reference to a global entry of the shared global table that includes the same alphanumerical HTTP header.

39. A coding device for encoding HTTP messages into a bitstream, an HTTP message including an initial list of HTTP headers, the device comprising:

a memory;

a computer processing unit (CPU) coupled to the memory which executes the following:

receiving a plurality of HTTP messages in serial;

comparing a subsequent HTTP message to a local indexing table generated from a prior HTTP message to determine a first group of grouping indexes representing HTTP headers of the initial list of the HTTP message that are already indexed in the local indexing table and a second group of literal values forming other HTTP headers of the initial list of the HTTP message not yet indexed in said local indexing table, wherein the first group of indexes represents HTTP headers of the subsequent HTTP message that are similar to HTTP headers of the prior HTTP message and the second group of literal values represents HTTP headers of the subsequent HTTP message that are different than the HTTP headers of the prior HTTP message;

encoding the indexes of the first group to obtain a binary representation of the indexes representing the HTTP headers already indexed;

binary compressing at least a serialized binary representation of the literal values of the second group;

updating the local indexing table by adding indexes corresponding to the second group in parallel to the binary compressing of the serialized binary representation of the literal values of the second group; and concatenating the binary representation of the indexed of the first group with the compressed binary representation of the second group to obtain a binary representation of the initial list of the HTTP message as an encoded bitstream of the HTTP headers.

40. A coding device for encoding HTTP messages to send over a plurality of network connections established with a plurality of respective addressee entities, each HTTP message including a list of alphanumerical HTTP headers, the device comprising:

a memory;

a computer processing unit (CPU) coupled to the memory which executes the following:

determining, from the plurality of network connections, a connection established with one of the addressee entities on which the HTTP message has to be sent;

determining a local indexing table specific to the determined connection established with the addressee entity, the local indexing table associating, in local entries, alphanumerical HTTP headers with respective indexes to be used to encode the alphanumerical HTTP headers;

encoding the list of alphanumerical HTTP headers of the HTTP message to be sent, using alphanumerical HTTP header indexing based on the determined local indexing table specific to the determined connection established with the addressee entity;

wherein a global table shared between the network connections established with the plurality of addressee entities and associates, in global entries, alphanumerical HTTP headers with global indexes; and the local indexing table of each connection established with one of the addressee entities, including the determined connections, associates at least one alphanumerical HTTP header with a respective index by providing, the corresponding local entry, a reference to a global entry of the shared global table that includes the same alphanumerical HTTP header.

* * * * *